(12) United States Patent
Zhao

(10) Patent No.: US 12,058,857 B2
(45) Date of Patent: Aug. 6, 2024

(54) THREE-DIMENSIONAL MEMORY DEVICES WITH DRAIN SELECT GATE CUT AND METHODS FOR FORMING AND OPERATING THE SAME

(71) Applicant: YANGTZE MEMORY TECHNOLOGIES CO., LTD., Wuhan (CN)

(72) Inventor: Lichuan Zhao, Wuhan (CN)

(73) Assignee: YANGTZE MEMORY TECHNOLOGIES CO., LTD., Wuhan (CN)

( * ) Notice: Subject to any disclaimer, the term of this patent is extended or adjusted under 35 U.S.C. 154(b) by 972 days.

(21) Appl. No.: 16/944,883

(22) Filed: Jul. 31, 2020

(65) Prior Publication Data

US 2021/0391353 A1 Dec. 16, 2021

Related U.S. Application Data

(63) Continuation of application No. PCT/CN2020/095695, filed on Jun. 12, 2020.

(51) Int. Cl.
*H10B 43/27* (2023.01)
*G11C 16/08* (2006.01)
*G11C 16/24* (2006.01)
*G11C 16/34* (2006.01)

(52) U.S. Cl.
CPC ............. *H10B 43/27* (2023.02); *G11C 16/08* (2013.01); *G11C 16/24* (2013.01); *G11C 16/34* (2013.01)

(58) Field of Classification Search
CPC ........ H10B 43/27; H10B 43/10; H10B 41/27; H01L 21/7684; H01L 23/5283; H01L 23/535; H01L 21/76895; H01L 21/76805
USPC .......................................... 257/324; 438/216
See application file for complete search history.

(56) References Cited

U.S. PATENT DOCUMENTS

| | | | |
|---|---|---|---|
| 2017/0098658 | A1 | 4/2017 | Matsuda et al. |
| 2018/0138194 | A1 | 5/2018 | Shigemura et al. |
| 2018/0358102 | A1 | 12/2018 | Zhang et al. |
| 2019/0096683 | A1 | 3/2019 | Sakuma et al. |
| 2020/0168623 | A1 | 5/2020 | Nishikawa et al. |

(Continued)

FOREIGN PATENT DOCUMENTS

| | | |
|---|---|---|
| CN | 108461499 A | 8/2018 |
| CN | 109716522 A | 5/2019 |

(Continued)

*Primary Examiner* — Thinh T Nguyen
(74) *Attorney, Agent, or Firm* — BAYES PLLC

(57) ABSTRACT

Embodiments of 3D memory devices and methods for forming and operating the same are disclosed. In an example, a 3D memory device includes a memory stack, a plurality of memory strings, and a plurality of bit line contacts each in contact with a respective one of the plurality of memory strings. The memory stack includes interleaved conductive layers and dielectric layers. Each memory string extends vertically through the memory stack. The conductive layers include a plurality of drain select gate (DSG) lines configured to control drains of the plurality of memory strings. The plurality of memory strings are divided into a plurality of regions that are a minimum repeating unit of the memory stack in a plan view. Each of the plurality of memory strings abuts at least one of the DSG lines.

13 Claims, 15 Drawing Sheets

(56) References Cited

U.S. PATENT DOCUMENTS

2020/0402992 A1   12/2020  Otsu et al.
2021/0118901 A1*  4/2021   Yang ................. H01L 27/11582

FOREIGN PATENT DOCUMENTS

| CN | 109791932 A | 5/2019 |
|---|---|---|
| CN | 110770912 A | 2/2020 |
| KR | 20120026273 A | 3/2012 |
| TW | 201727636 A | 8/2017 |
| TW | 201939717 A | 10/2019 |
| TW | 202011586 A | 3/2020 |
| TW | 202017157 A | 5/2020 |
| WO | 2018/174966 A1 | 9/2018 |

* cited by examiner

THREE-DIMENSIONAL MEMORY DEVICES WITH DRAIN SELECT GATE CUT AND METHODS FOR FORMING AND OPERATING THE SAME

CROSS-REFERENCE TO RELATED APPLICATIONS

This application is continuation of International Application No. PCT/CN2020/095695, filed on Jun. 12, 2020, entitled "THREE-DIMENSIONAL MEMORY DEVICES WITH DRAIN SELECT GATE CUT AND METHODS FOR FORMING AND OPERATING THE SAME," which is hereby incorporated by reference in its entirety. This application is also related to U.S. application Ser. No. 16/944,869, filed on Jul. 31, 2020, entitled "THREE-DIMENSIONAL MEMORY DEVICES WITH DRAIN SELECT GATE CUT AND METHODS FOR FORMING THE SAME," which is hereby incorporated by reference in its entirety.

BACKGROUND

Embodiments of the present disclosure relate to three-dimensional (3D) memory devices and fabrication and operation methods thereof.

Planar memory cells are scaled to smaller sizes by improving process technology, circuit design, programming algorithm, and fabrication process. However, as feature sizes of the memory cells approach a lower limit, planar process and fabrication techniques become challenging and costly. As a result, memory density for planar memory cells approaches an upper limit.

A 3D memory architecture can address the density limitation in planar memory cells. The 3D memory architecture includes a memory array and peripheral devices for controlling signals to and from the memory array.

SUMMARY

Embodiments of 3D memory devices and methods for forming and operating the same are disclosed herein.

In one example, a 3D memory device includes a memory stack, a plurality of memory strings, and a plurality of bit line contacts each in contact with a respective one of the plurality of memory strings. The memory stack includes interleaved conductive layers and dielectric layers. Each memory string extends vertically through the memory stack. The conductive layers include a plurality of drain select gate (DSG) lines configured to control drains of the plurality of memory strings. The plurality of memory strings are divided into a plurality of regions that are a minimum repeating unit of the memory stack in a plan view. Each of the plurality of memory strings abuts at least one of the DSG lines.

In another example, a method for forming a 3D memory device is disclosed. A dielectric stack including interleaved sacrificial layers and dielectric layers is formed above a substrate. A first channel structure and a second channel structure each extending vertically through the dielectric stack are formed. A portion of the uppermost one of the sacrificial layers and a top portion of the second channel structure abutting the removed portion of the uppermost sacrificial layer are removed, such that the first channel structure extends vertically through a first region of the dielectric stack including a remainder of the uppermost sacrificial layer, and a remainder of the second channel structure extends vertically through a second region of the dielectric stack free of the uppermost sacrificial layer.

In still another example, a method for operating a 3D memory device is disclosed. The 3D memory device including a first memory string, a second memory string, a first drain select gate (DSG) line abutting the first memory string at a first cell, and a second DSG line abutting the first and second memory strings at a second cell and a third cell, respectively, is provided. Threshold voltages of the first, second, and third cells are set, such that the threshold voltage of the first cell is higher than the threshold voltage of the second cell, and the threshold voltage of the third cell is higher than the threshold voltage of the second cell. A first voltage and a second voltage are applied to the first and second DSG lines, respectively, to select the first memory string and deselect the second memory string, when the first voltage is higher than the threshold of the first cell, and the second voltage is higher than the threshold voltage of the second cell but lower than the threshold voltage of the third cell.

BRIEF DESCRIPTION OF THE DRAWINGS

The accompanying drawings, which are incorporated herein and form a part of the specification, illustrate embodiments of the present disclosure and, together with the description, further serve to explain the principles of the present disclosure and to enable a person skilled in the pertinent art to make and use the present disclosure.

Figure 1A:
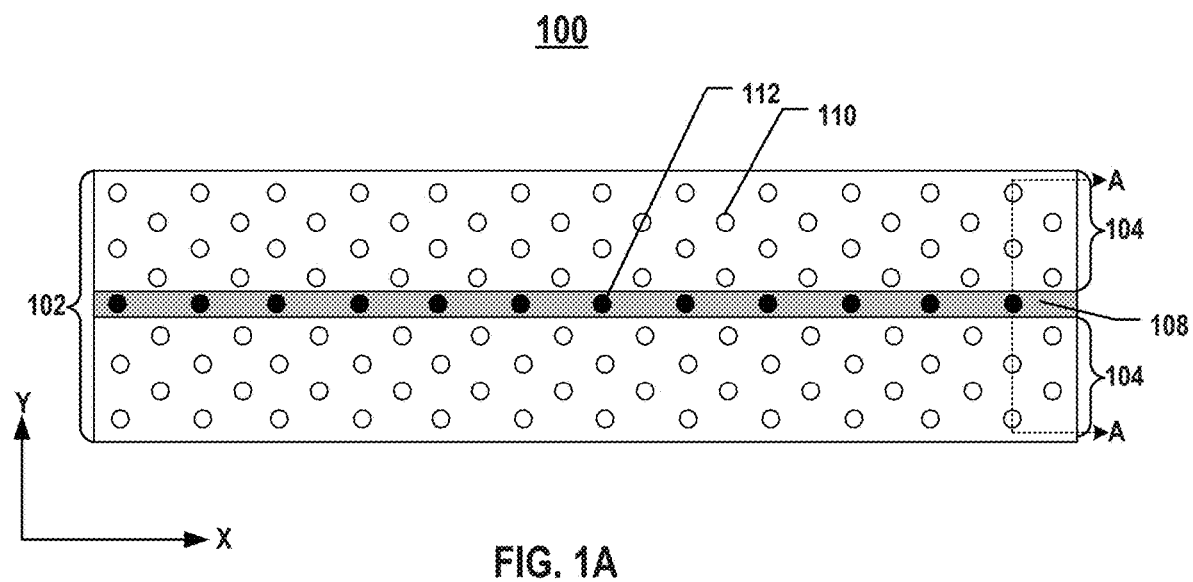
FIGS. 1A and 1B illustrate a plan view and a side view of a cross-section of a 3D memory device with DSG cut.

Embodiments of the present disclosure will be described with reference to the accompanying drawings.

DETAILED DESCRIPTION

Although specific configurations and arrangements are discussed, it should be understood that this is done for illustrative purposes only. A person skilled in the pertinent art will recognize that other configurations and arrangements can be used without departing from the spirit and scope of the present disclosure. It will be apparent to a person skilled in the pertinent art that the present disclosure can also be employed in a variety of other applications.

It is noted that references in the specification to "one embodiment," "an embodiment," "an example embodiment," "some embodiments," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure, or characteristic is described in connection with an embodiment, it would be within the knowledge of a person skilled in the pertinent art to effect such feature, structure, or characteristic in connection with other embodiments whether or not explicitly described.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context. In addition, the term "based on" may be understood as not necessarily intended to convey an exclusive set of factors and may, instead, allow for existence of additional factors not necessarily expressly described, again, depending at least in part on context.

It should be readily understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations), and the spatially relative descriptors used herein may likewise be interpreted accordingly.

As used herein, the term "substrate" refers to a material onto which subsequent material layers are added. The substrate itself can be patterned. Materials added on top of the substrate can be patterned or can remain unpatterned. Furthermore, the substrate can include a wide array of semiconductor materials, such as silicon, germanium, gallium arsenide, indium phosphide, etc. Alternatively, the substrate can be made from an electrically non-conductive material, such as a glass, a plastic, or a sapphire wafer.

As used herein, the term "layer" refers to a material portion including a region with a thickness. A layer can extend over the entirety of an underlying or overlying structure or may have an extent less than the extent of an underlying or overlying structure. Further, a layer can be a region of a homogeneous or inhomogeneous continuous structure that has a thickness less than the thickness of the continuous structure. For example, a layer can be located between any pair of horizontal planes between, or at, a top surface and a bottom surface of the continuous structure. A layer can extend horizontally, vertically, and/or along a tapered surface. A substrate can be a layer, can include one or more layers therein, and/or can have one or more layer thereupon, thereabove, and/or therebelow. A layer can include multiple layers. For example, an interconnect layer can include one or more conductor and contact layers (in which interconnect lines and/or via contacts are formed) and one or more dielectric layers.

As used herein, the term "nominal/nominally" refers to a desired, or target, value of a characteristic or parameter for a component or a process operation, set during the design phase of a product or a process, together with a range of values above and/or below the desired value. The range of values can be due to slight variations in manufacturing processes or tolerances. As used herein, the term "about" indicates the value of a given quantity that can vary based on a particular technology node associated with the subject semiconductor device. Based on the particular technology node, the term "about" can indicate a value of a given quantity that varies within, for example, 10-30% of the value (e.g., ±10%, ±20%, or ±30% of the value).

As used herein, the term "3D memory device" refers to a semiconductor device with vertically oriented strings of memory cell transistors (referred to herein as "memory strings," such as NAND memory strings) on a laterally-oriented substrate so that the memory strings extend in the vertical direction with respect to the substrate. As used herein, the term "vertical/vertically" means nominally perpendicular to the lateral surface of a substrate.

In some 3D memory devices, such as 3D NAND memory devices, DSG cuts, such as top select gate (TSG) cuts, can be used to further divide each memory block into multiple regions (e.g., fingers) to better control the memory cells in the memory block. The NAND memory strings, divided by the TSG cuts into different regions, can be individually selected or deselected, so that various operations can be performed in the desired regions (e.g., fingers) of the 3D NAND memory device.

Figure 1B:
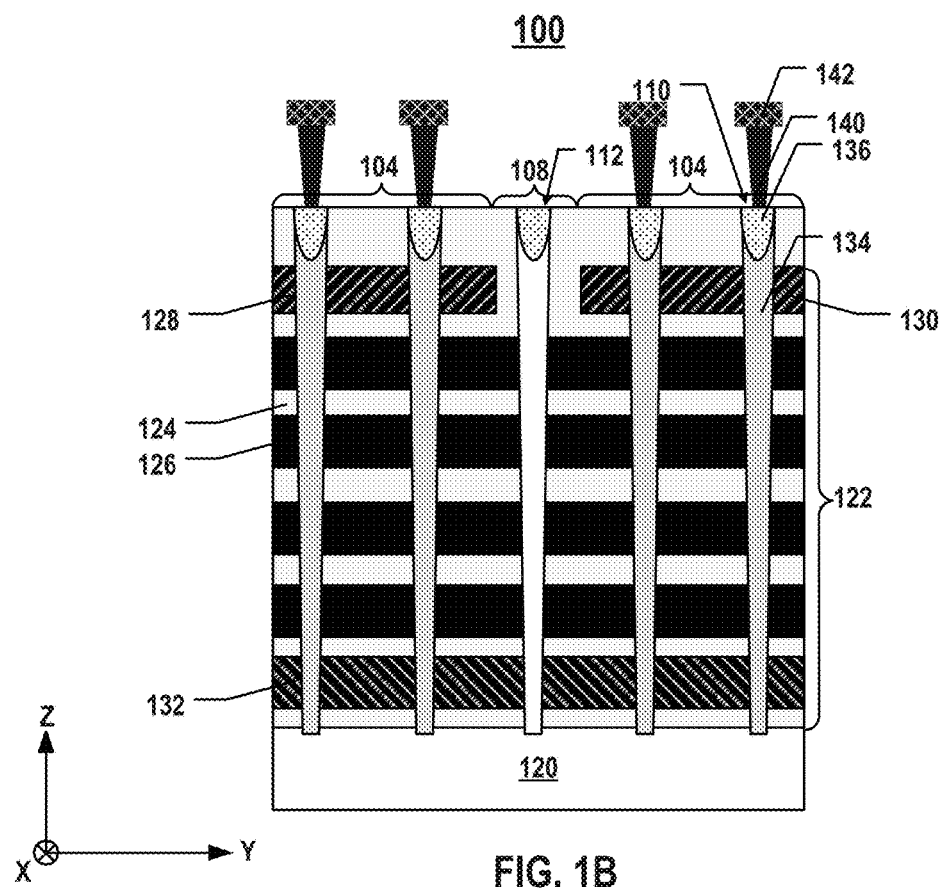

FIGS. 1A and 1B illustrate a plan view and a side view of a cross-section of a 3D memory device 100 with DSG cut. It is noted that x- and y-axes are included in FIG. 1A to illustrate two orthogonal directions in the wafer plane. The x-direction is the word line direction, and the y-direction is the bit line direction. 3D memory device 100 includes a memory block 102 having a plurality of memory strings 110. Memory block 102 represents the minimum repeating unit of a memory stack 122 of 3D memory device 100 in the plan view. Memory stack 122 includes a number of minimum repeating units, e.g., memory block 102. It is understood that the minimum repeating unit may be referred to as any suitable terms other than "memory block" used herein. As shown in FIG. 1A, 3D memory device 100 includes a DSG cut 108 extending laterally in the x-direction (the word line direction), separating memory block 102 into two memory fingers 104, such that memory strings 110 in different memory fingers 104 can be individually selected or deselected.

As shown in FIG. 1B, which is the side view of the cross-section of 3D memory device 100 along the AA plane in FIG. 1A, 3D memory device 100 includes memory stack 122 above a substrate 120. It is noted that x-, y- and z-axes are included in FIG. 1B to further illustrate the spatial relationship of the components in 3D memory device 100. Substrate 120 includes two lateral surfaces extending laterally in the x-y plane: a top surface on the front side of the wafer on which 3D memory device 100 can be formed, and a bottom surface on the backside opposite to the front side of the wafer. The z-axis is perpendicular to both the x and y axes. As used herein, whether one component (e.g., a layer or a device) is "on," "above," or "below" another component (e.g., a layer or a device) of a semiconductor device (e.g., 3D memory device 100) is determined relative to the substrate of the semiconductor device (e.g., substrate 120) in the z-direction (the vertical direction perpendicular to the x-y plane) when the substrate is positioned in the lowest plane of the semiconductor device in the z-direction. The same notion for describing the spatial relationships is applied throughout the present disclosure.

Memory stack 122 includes vertically interleaved conductive layers 126 and dielectric layers 124 in the z-direction. Conductive layers 126 include DSG lines 128 and 130 (e.g., the uppermost conductive layer separated by DSG cut 108) that are configured to control the drains of memory strings 110 in a respective memory finger 104. Conductive layers 126 also include a source select gate (SSG) line 132 (sometimes known as the bottom select gate (BSG), e.g., the lowermost conductive layer in FIG. 1B) that is configured to control the common source of memory strings 110 in memory block 102. As shown in FIG. 1B, each memory string 110 includes a channel structure 134 and a channel plug 136 above and in contact with channel structure 134. 3D memory device 100 further includes a plurality of bit line contacts 140 each above and in contact with a respective channel plug 136 of memory string 110, and a plurality of bit lines 142 each above and in contact with a respective bit line contact 140. Each memory string 110 is thus a functional memory string as its drain is electrically connected to a respective bit line 142 through a respective bit line contact 140 for individual addressing as well as it abuts DSG line 128 or 130 for controlling its drain. In contrast, 3D memory device 100 also includes a plurality of dummy memory strings 112, which are not functional due to DSG cut 108. As shown in FIG. 1B, dummy memory string 112 does not abut any DSG line and is not electrically connected to any bit line and thus, cannot be addressed and controlled.

The existence of dummy memory strings 112 due to DSG cut 108 reduces the effective device area and memory cell density of 3D memory device 100. Moreover, since dummy memory strings 112 still abut SSG line 132, during the read and verify operations, the voltage of SSG line 132 can be applied to dummy memory strings 112, thereby introducing parasitic capacitance between conductive layers 126 (e.g., as word lines) and dummy memory strings 112, which can affect the electrical performance of 3D memory device 100 during the read and verify operations.

Various embodiments in accordance with the present disclosure provide 3D memory devices with improved DSG cut layout and design and fabrication and operation methods thereof. Each memory string in the minimum repeating unit (e.g., a memory block) of the 3D memory devices disclosed herein can abut at least one of the DSG lines and be electrically connected to a respective bit line to avoid any dummy memory strings caused by DSG cut. In some embodiments, different numbers of DSG lines are formed in different regions in the minimum repeating unit. In some embodiments, each memory string has nominally the same height to reduce the fabrication complexity. The threshold voltages of various DSG cells of the memory strings in the 3D memory devices can be set to desired levels, in combination with the voltages applied to the DSG lines at desired levels, to accommodate the novel device architectures disclosed herein. As a result, the effective device area and memory cell density of the 3D memory devices can be increased, and the electrical performance can be improved.

Figure 2A:
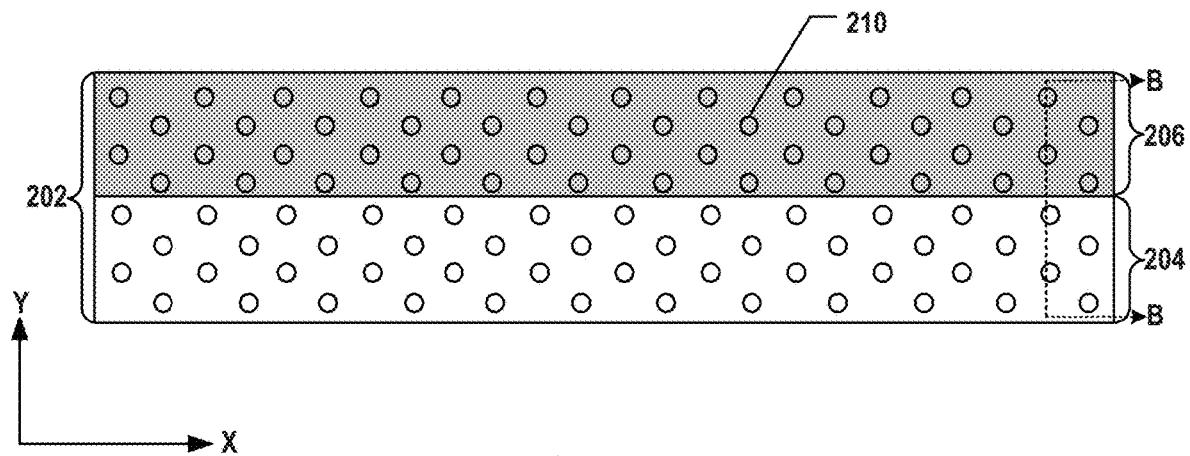
FIGS. 2A and 2B illustrate a plan view and a side view of a cross-section of an exemplary 3D memory device with DSG cut, according to some embodiments of the present disclosure.
Figure 2B:
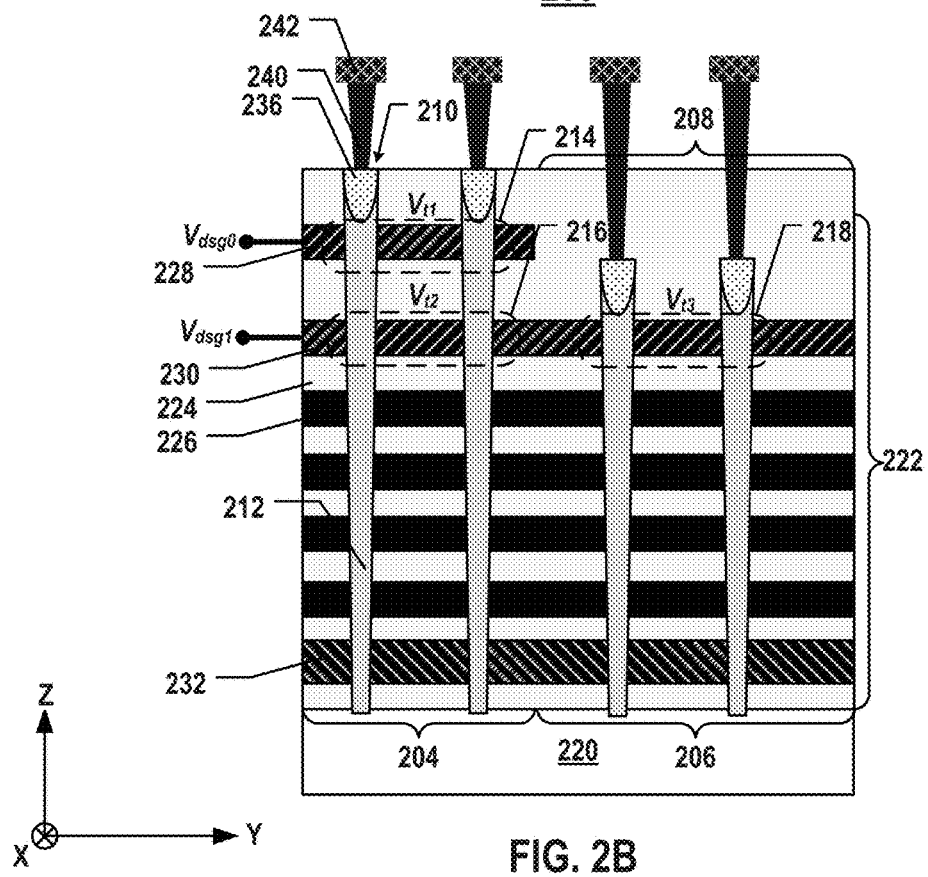

FIGS. 2A and 2B illustrate a plan view and a side view of a cross-section of an exemplary 3D memory device 200 with DSG cut, according to some embodiments of the present disclosure. FIG. 2B shows the side view of the cross-section of 3D memory device 200 along the BB plane in FIG. 2A. 3D memory device 200 can include a substrate 220 and a memory stack 222 above substrate 220. Substrate 220 can include silicon (e.g., single crystalline silicon), silicon germanium (SiGe), gallium arsenide (GaAs), germanium (Ge), silicon on insulator (SOI), germanium on insulator (GOI), or any other suitable materials. In some embodiments, substrate 220 is a thinned substrate (e.g., a semiconductor layer), which was thinned by grinding, etching, chemical mechanical polishing (CMP), or any combination thereof.

In some embodiments, 3D memory device 200 is part of a monolithic 3D memory device, in which the components of the monolithic 3D memory device (e.g., memory cells and peripheral devices) are formed on a single substrate (e.g., substrate 220). Peripheral devices (not shown), such as any suitable digital, analog, and/or mixed-signal peripheral circuits used for facilitating the operation of 3D memory device 200, can be formed above memory stack 222. In some embodiments, 3D memory device 200 is part of a non-monolithic 3D memory device, in which the components are formed separately on different substrates and then bonded in a face-to-face manner, a face-to-back manner, or a back-to-back manner. Peripheral devices (not shown) can be formed on a separate substrate different from substrate 220. As part of a bonded non-monolithic 3D memory device, substrate 220 can be a thinned substrate (e.g., a semiconductor layer, which is not the substrate of the bonded non-monolithic 3D memory device), and the back-end-of-line (BEOL) interconnects of the non-monolithic 3D memory device can be formed on the backside of thinned substrate 220.

Nevertheless, 3D memory device 200 can be part of a monolithic or non-monolithic 3D memory device regardless of whether 3D memory device 200 is above or below the peripheral devices (not shown). For ease of reference, FIGS. 2A and 2B depict a state of 3D memory device 200 in which substrate 220 is positioned below memory stack 222 in the z-direction, regardless of whether substrate 220 is a thinned substrate on memory stack 222 of 3D memory device 200 can be formed. The same notion for describing the spatial relationships is applied throughout the present disclosure.

In some embodiments, 3D memory device 200 is a NAND Flash memory device in which memory cells are provided in the form of an array of NAND memory strings 210 each extending vertically through memory stack 222 above substrate 220, as shown in the side view of FIG. 2B. As shown in the plan view of FIG. 2A, memory stack 222 includes a plurality of regions 204 and 206 that are a minimum repeating unit 202 of memory stack 222, including a DSG cut region 206 and a non-DSG cut region 204, according to some embodiments. That is, 3D memory device 200 can include a plurality of minimum repeating units 202, for example, interleaved DSG cut regions 206 and non-DSG cut regions 204, in the plan view. In some embodiments, one minimum repeating unit 202 corresponds to a memory block of 3D memory device 200. In some embodiments, multiple minimum repeating units 202, e.g., two or three minimum repeating units 202, correspond to a memory block of 3D memory device 200. It is understood that in some examples, memory blocks may be separated by gate line slits (GLSs, not shown) each extending laterally in the word line direction (e.g., the x-direction in FIG. 2A). DSG cut regions 206 can also extend laterally in the word line direction, parallel to the GLSs. The array of memory strings 210 can be divided into regions 204 and 206 of memory stack 222. In some embodiments, the size of DSG cut region 206 is nominally the same as the size of non-DSG cut region 204, and the number of memory strings 210 in DSG cut region 206 is nominally the same as the number of memory strings 210 in non-DSG cut region 204. In other words, memory strings 210 can be evenly divided into regions 204 and 206 of memory stack 222.

As shown in the side view of FIG. 2B, memory stack 222 of 3D memory device 200 can include a plurality of pairs each including a conductive layer 226 and a dielectric layer 224. That is, memory stack 222 includes vertically interleaved conductive layers 226 and dielectric layers 224 in the z-direction, according to some embodiments. Conductive layers 226 and dielectric layers 224 in memory stack 222 can alternate in the vertical direction. The number of the pairs of conductive layers 226 and dielectric layers 224 in memory stack 222 (e.g., 32, 64, 96, 128, 144, 160, 176, 192, 208, 224, 240, 256, etc.) determines the number of memory cells in 3D memory device 200. It is understood that in some examples, memory stack 222 may have a multi-deck architecture (not shown), which includes a plurality of memory decks stacked over one another. The numbers of the pairs of conductive layers 226 and dielectric layers 224 in each memory deck can be the same or different. Conductive layers 226 can include conductive materials including, but not limited to, tungsten (W), cobalt (Co), copper (Cu), aluminum (Al), polysilicon, doped silicon, silicides, or any combination thereof. Dielectric layers 224 can include dielectric materials including, but not limited to, silicon oxide, silicon nitride, silicon oxynitride, or any combination thereof.

In some embodiments, the outermost ones of conductive layers 226 include a plurality of DSG lines 228 and 230 and an SSG line 232. The rest of conductive layer 226 vertically between SSG line 232 and DSG lines 228 and 230 can include gate lines surrounding memory strings 210 and extending laterally as word lines. As shown in FIG. 2B, DSG line 228 is the first uppermost conductive layer, DSG line 230 is the second uppermost conductive layer, and SSG line 232 is the lowermost conductive layer, according to some embodiments. In some embodiments, each memory string 210 abuts SSG line 232, which is configured to control a common source of memory strings 210 in minimum repeating unit 202 of memory stack 222. As SSG line 232 is the lowermost conductive layer in FIG. 2B, SSG line 232 is also referred to herein as the BSG line. In some embodiments, each memory string 210 abuts at least one of DSG lines 228 and 230, which are configured to control the drains of memory strings 210. Each memory string 210 in non-DSG cut region 204 abuts both DSG lines 228 and 230, such that the drain of memory string 210 in non-DSG cut region 204 is controlled by both DSG lines 228 and 230, according to some embodiments. Each memory string 210 in DSG cut region 206 abuts DSG line 230, but not DSG line 228 due to DSG cut 208, such that the drain of memory string 210 in DSG cut region 206 is controlled by DSG line 230, but not DSG line 228. As DSG lines 228 and 230 are the uppermost conductive layers in FIG. 2B, DSG lines 228 and 230 are also referred to herein as the TSG lines.

As shown in FIG. 2B, a portion of DSG line 228 (e.g., the first uppermost conductive layer) in DSG cut region 206 is removed by DSG cut 208. That is, DSG lines 228 and 230 can have different lateral dimensions, for example, in the y-direction (the bit line direction). DSG line 230 is a continuous conductive plate extending laterally in the x-y plane, while DSG line 228 is disconnected in the y-direction by DSG cuts 208 at each DSG cut region 206 of memory stack 222 of 3D memory device 200, according to some embodiments. As a result, the number of DSG lines 228 and 230 (e.g., 2) in non-DSG cut region 204 is greater than the number of DSG lines 230 (e.g., 1) in DSG cut region 206, according to some embodiments. The layout and design of 3D memory device 200 avoid any dummy memory strings (e.g., shown in FIGS. 1A and 1B) due to DSG cut. For example, DSG cut region 206 of 3D memory device 200 may be free of dummy memory strings, and each memory string 210 in minimum repeating unit 202 of memory stack 222 may be functional memory strings. Thus, the effective device area and memory cell density of 3D memory device 200 can be increased, and the electrical performance can be improved, compared with 3D memory device 100.

In some embodiments, memory strings 210 in non-DSG cut region 204 have nominally the same height, and memory strings 210 in DSG cut region 206 have nominally the same height. The height of each memory string 210 in non-DSG cut region 204 is greater than the height of each memory string 210 in DSG cut region 206, according to some embodiments. For example, the upper ends of memory strings 210 in non-DSG cut region 204 may be above DSG line 228 (e.g., the first uppermost conductive layer 226), and the upper ends of memory strings 210 in DSG cut region 206 may be between DSG line 228 and DSG line 230 (e.g., the second uppermost conductive layer 226) in the vertical direction. That is, memory strings 210 in DSG cut region 206 do not extend beyond DSG line 228, according to some embodiments.

As shown in FIG. 2B, each memory string 210 can include a channel structure 212 and a channel plug 236 at the upper end of memory string 210. As used herein, the "upper end" of a component (e.g., memory string 210) is the end farther away from substrate 220 in the z-direction, and the "lower end" of the component (e.g., memory string 210) is the end closer to substrate 220 in the z-direction when substrate 220 is positioned in the lowest plane of 3D memory device 200. Channel structure 212 can include a channel hole filled with a semiconductor layer (e.g., as a semiconductor channel) and a composite dielectric layer (e.g., as a memory film). In some embodiments, the semiconductor channel includes silicon, such as amorphous silicon, polysilicon, or single crystalline silicon. In some embodiments, the memory film is a composite layer including a tunneling layer, a storage layer (also known as a "charge trap layer"), and a blocking layer. The remaining space of channel structure 212 can be partially or fully filled with a capping layer including dielectric materials, such as silicon oxide, and/or an air gap. Channel structure 212 can have a cylinder shape (e.g., a pillar shape). The capping layer, semiconductor channel, tunneling layer, storage layer, and blocking layer are arranged radially from the center toward the outer surface of the pillar in this order, according to some embodiments. The tunneling layer can include silicon oxide, silicon oxynitride, or any combination thereof. The storage layer can include silicon nitride, silicon oxynitride, silicon, or any combination thereof. The blocking layer can include silicon oxide, silicon oxynitride, high dielectric constant (high-k) dielectrics, or any combination thereof.

Channel plug 236 can be above and in contact with the upper end of the semiconductor channel of channel structure 212. Channel plug 236 can include semiconductor materials (e.g., polysilicon). By covering the upper end of channel structure 236 during the fabrication of 3D memory device 200, channel plug 236 can function as an etch stop layer to prevent etching of dielectrics filled in channel structure 212. In some embodiments, channel plug 236 can function as part of the drain of memory string 210. In some embodiments, each channel plug 236 of memory strings 210 in minimum repeating unit 202 (including both DSG cut region 206 and non-DSG cut region 204) has nominally the same height. That is, the heights of channel plugs 236 can be nominally the same among different regions 204 and 206. In some embodiments, the lower ends of channel plugs 236 in non-DSG cut region 204 are higher than DSG line 228 (e.g., the first uppermost conductive layer 226). In some embodiments, the lower ends of channel plugs 236 in DSG cut region 206 are higher than DSG line 230 (e.g., the second uppermost conductive layer 226), and the upper ends of channel plugs 236 (the upper ends of memory strings 210) in DSG cut region 206 are lower than DSG line 228. That is, channel plug 236 in DSG cut region 206 is vertically between DSG lines 228 and 230, according to some embodiments.

Each memory string 210 can include a plurality of cells at the intersections of conductive layers 226 and channel structures 212. Each cell can be a transistor having a threshold voltage that can be set to a desired level from its intrinsic threshold voltage by, for example, the manufacturer and/or the user, after the manufacturing of 3D memory device 200, using, for example, the program and/or erase operations. The cells can include memory cells controlled through the gate lines/word lines of conductive layers 226 for data storage. The cells can also include DSG cells 214, 216, and 218 controlled through DSG lines 228 and 230 for controlling the drains of memory strings 210. The cells can further include SSG cells controlled through SSG line 232 for controlling the common source of memory strings 210. In some embodiments, each memory string 210 in non-DSG cut region 204 includes a first DSG cell 214 at the intersection where DSG line 228 abuts memory string 210 and a second DSG cell 216 at the intersection where DSG line 230 abuts memory string 210. As described below in detail with respect to the operation of 3D memory device 200, memory string 210 in non-DSG cut region 204 can be selected or deselected by setting the threshold voltages of first and second DSG cells 214 and 216 to suitable levels and applying the first voltage $V_{dsg0}$ and the second voltage $V_{dsg1}$ at suitable levels to DSG lines 228 and 230, respectively. In some embodiments, each memory string 210 in DSG cut region 206 includes a third DSG cell 218 at the intersection where DSG line 230 abuts memory string 210. As described below in detail with respect to the operation of 3D memory device 200, memory string 210 in DSG cut region 206 can be selected or deselected by setting the threshold voltages of third DSG cell 218 to a suitable level and applying the second voltage $V_{dsg1}$ at a suitable level to DSG line 230.

As shown in FIG. 2B, 3D memory device 200 also includes bit line contacts 240 each above and in contact with a respective one of memory string 210 in minimum repeating unit 202 of memory stack 222. In some embodiments, each bit line contact 240 is formed on top of the upper end of a respective memory string 210 (i.e., channel plug 236). Bit line contacts 240 are parts of "local contacts" (also known as "CI"), which are in contact with a structure (e.g., memory string 210) in memory stack 222 directly. Bit line contacts 240 can include conductive materials including, but not limited to, Cu, Al, W, Co, silicides, or any combination thereof. In some embodiments, the upper ends of each bit line contact 240 are flush with one another. As the upper ends of memory strings 210 in non-DSG cut region 204 are higher than the upper ends of memory strings 210 in DSG cut region 206, the height of each bit line contact 240 in DSG cut region 206 is greater than the height of each bit line contact 240 in non-DSG cut region 204, according to some embodiments.

As shown in FIG. 2B, 3D memory device 200 further includes bit lines 242 each above and in contact with a respective one of bit line contacts 240 in minimum repeating unit 202 of memory stack 222. Bit lines 242 can include conductive materials including, but not limited to, Cu, Al, W, Co, silicides, or any combination thereof. Different from 3D memory device 100 in FIG. 1B that includes dummy memory strings 112 without corresponding bit line contacts and bit lines, each memory string 210 of 3D memory device 200 in FIG. 2B is a functional memory string in contact with a respective bit line contact 240 and is electrically connected to a respective bit line 242 for individual addressing, according to some embodiments.

Figure 3A:
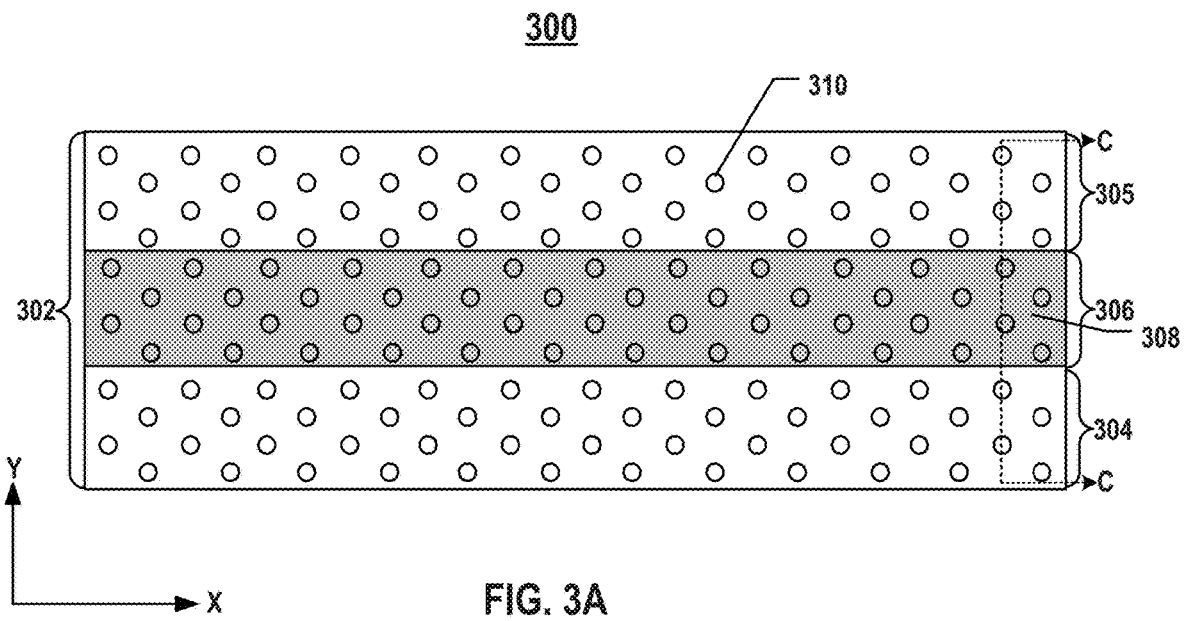
FIGS. 3A and 3B illustrate a plan view and a side view of a cross-section of another exemplary 3D memory device with DSG cut, according to some embodiments of the present disclosure.
Figure 3B:
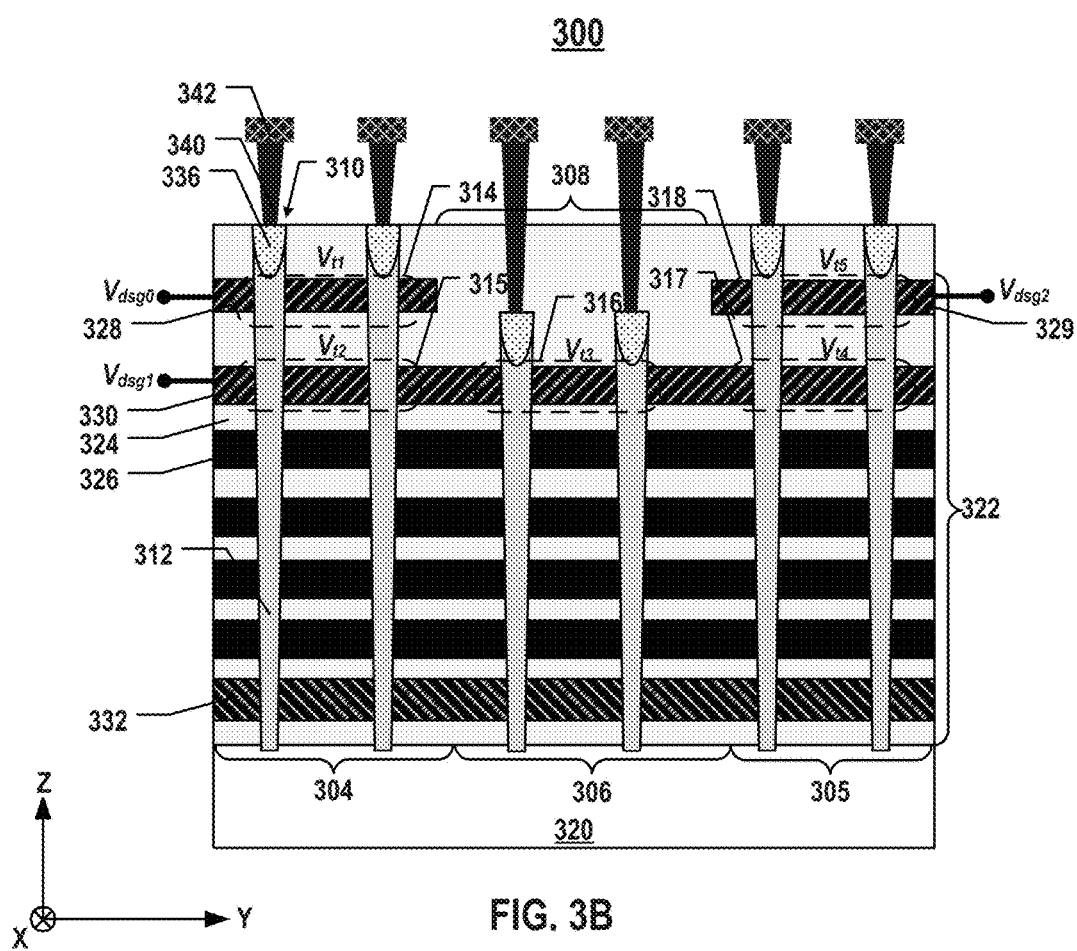

It is understood that the number of regions in the minimum repeating unit of the memory stack of a 3D memory device is not limited to 2 (e.g., one DSG cut region 206 and one non-DSG cut region 204 in minimum repeating unit 202 of 3D memory device 200), and may be any other suitable number, such as 3. For example, FIGS. 3A and 3B illustrate a plan view and a side view of a cross-section of another exemplary 3D memory device 300 with DSG cut, according to some embodiments of the present disclosure. FIG. 3B shows the side view of the cross-section of 3D memory device 300 along the CC plane in FIG. 3A. As shown in FIG. 3A, a minimum repeating unit 302 of 3D memory device 300 includes three regions: a DSG cut region 306 between two non-DSG cut regions 304 and 305 in the y-direction (the bit line direction) in the plan view. It is understood that the details of similar structures (e.g., materials, fabrication process, functions, etc.) in both 3D memory devices 200 and 300 may not be repeated below.

3D memory device 300 can include a substrate 320 and a memory stack 322 above substrate 320. In some embodiments, 3D memory device 300 is a NAND Flash memory device in which memory cells are provided in the form of an array of NAND memory strings 310 each extending vertically through memory stack 322 above substrate 320, as shown in the side view of FIG. 3B. The array of memory strings 310 can be divided into regions 304, 305, and 306 of memory stack 322. In some embodiments, the size of each non-DSG cut region 304 or 305 is nominally the same as the size of DSG cut region 306, and the number of memory strings 310 in each non-DSG cut region 304 or 305 is nominally the same as the number of memory strings 310 in DSG cut region 306. In other words, memory strings 310 can be evenly divided into regions 304, 305, and 306 (i e, minimum repeating unit 302) of memory stack 322.

Memory stack 322 includes vertically interleaved conductive layers 326 and dielectric layers 324 in the z-direction, according to some embodiments. In some embodiments, the outermost ones of conductive layers 326 include a plurality of DSG lines 328, 329, and 330 and an SSG line 332. The rest of conductive layer 326 vertically between SSG line 332 and DSG lines 328, 329, and 330 can include gate lines surrounding memory strings 310 and extending laterally as word lines. As shown in FIG. 3B, DSG lines 328 and 329 each are the first uppermost conductive layer 326, separated by DSG cut 308, and DSG line 330 is the second uppermost conductive layer 326, according to some embodiments. In some embodiments, each memory string 310 abuts at least one of DSG lines 328, 329, and 330, which are configured to control the drains of memory strings 310. Each memory string 310 in non-DSG cut region 304 abuts both DSG lines 328 and 330, such that the drain of memory string 310 in non-DSG cut region 304 is controlled by both DSG lines 328 and 330, according to some embodiments. Similarly, each memory string 310 in non-DSG cut region 305 abuts both DSG lines 329 and 330, such that the drain of memory string 310 in non-DSG cut region 305 is controlled by both DSG lines 329 and 330, according to some embodiments. Each memory string 310 in DSG cut region 306 abuts DSG line 330, but not DSG line 328 or 329 due to DSG cut 308, such that the drain of memory string 310 in DSG cut region 306 is controlled by DSG line 330, but not DSG line 328 or 329.

In some embodiments, memory strings 310 in non-DSG cut regions 304 and 305 have nominally the same height, and memory string 310 in DSG cut region 306 have nominally the same height. The height of each memory string 310 in non-DSG cut regions 304 and 305 is greater than the height of each memory string 310 in DSG cut region 306, according to some embodiments. For example, the upper ends of memory strings 310 in non-DSG cut regions 304 and 305 may be above DSG lines 328 and 329 (e.g., the first uppermost conductive layer 326), and the upper ends of memory strings 310 in DSG cut region 306 may be between DSG line 230 (e.g., the second uppermost conductive layer 326) and DSG lines 328 and 329 in the vertical direction. That is, memory strings 310 in DSG cut region 306 do not extend beyond DSG lines 328 and 329, according to some embodiments.

As shown in FIG. 3B, memory string 310 can include a channel structure 312 and a channel plug 336 at the upper end of memory string 310. In some embodiments, each channel plug 336 of memory strings 310 in minimum repeating unit 302 (including DSG cut region 306 and non-DSG cut regions 304 and 305) has nominally the same height. That is, the heights of channel plugs 336 can be nominally the same among different regions 304, 305, and 306. In some embodiments, the lower ends of channel plugs 336 in non-DSG cut regions 304 and 305 are higher than DSG lines 328 and 329 (e.g., the first uppermost conductive layer 326), and the lower ends of channel plugs 336 in DSG cut region 306 are higher than DSG line 330 (e.g., the second uppermost conductive layer 326).

Each memory string 310 can include a plurality of cells at the intersections of conductive layers 326 and channel structures 312. The cells can include memory cells controlled through the gate lines/word lines of conductive layers 326 for data storage. The cells can also include DSG cells 314, 315, 316, 317, and 318 controlled through DSG lines 328, 329, and 330 for controlling the drains of memory strings 310. The cells can further include SSG cells controlled through SSG line 332 for controlling the common source of memory strings 310. In some embodiments, each memory string 310 in non-DSG cut region 304 includes a first DSG cell 314 at the intersection where DSG line 328 abuts memory string 310 and a second DSG cell 315 at the intersection where DSG line 330 abuts memory string 310. As described below in detail with respect to the operation of 3D memory device 300, memory string 310 in non-DSG cut region 304 can be selected or deselected by setting the threshold voltages of first and second DSG cells 314 and 315 to suitable levels and applying the first voltage $V_{dsg0}$ and the second voltage $V_{dsg1}$ at suitable levels to DSG lines 328 and 330, respectively. Similarly, in some embodiments, each memory string 310 in non-DSG cut region 305 includes a fifth DSG cell 318 at the intersection where DSG line 329 abuts memory string 310 and a fourth DSG cell 317 at the intersection where DSG line 330 abuts memory string 310. As described below in detail with respect to the operation of 3D memory device 300, memory string 310 in non-DSG cut region 305 can be selected or deselected by setting the threshold voltages of fourth and fifth DSG cells 317 and 318 to suitable levels and applying the third voltage $V_{dsg2}$ and the second voltage $V_{dsg1}$ at suitable levels to DSG lines 329 and 330, respectively. In some embodiments, each memory string 310 in DSG cut region 306 includes a third DSG cell 316 at the intersection where DSG line 330 abuts memory string 310. As described below in detail with respect to the operation of 3D memory device 300, memory string 310 in DSG cut region 306 can be selected or deselected by setting the threshold voltages of third DSG cell 316 to a suitable level and applying the second voltage $V_{dsg1}$ at a suitable level to DSG line 330.

As shown in FIG. 3B, 3D memory device 300 can also include bit line contacts 340 each above and in contact with a respective one of memory string 310 in minimum repeating unit 302 of memory stack 322. In some embodiments, each bit line contact 340 is formed on top of the upper end of a respective memory string 310 (i.e., channel plug 336). As the upper ends of memory strings 310 in non-DSG cut regions 304 and 305 are higher than the upper ends of memory strings 310 in DSG cut region 306, the height of each bit line contact 340 in DSG cut region 306 is greater than the height of each bit line contact 340 in non-DSG cut regions 304 and 305, according to some embodiments. 3D memory device 300 can further include bit lines 342 each above and in contact with a respective one of bit line contacts 340 in minimum repeating unit 302 of memory stack 322.

Figure 4A:
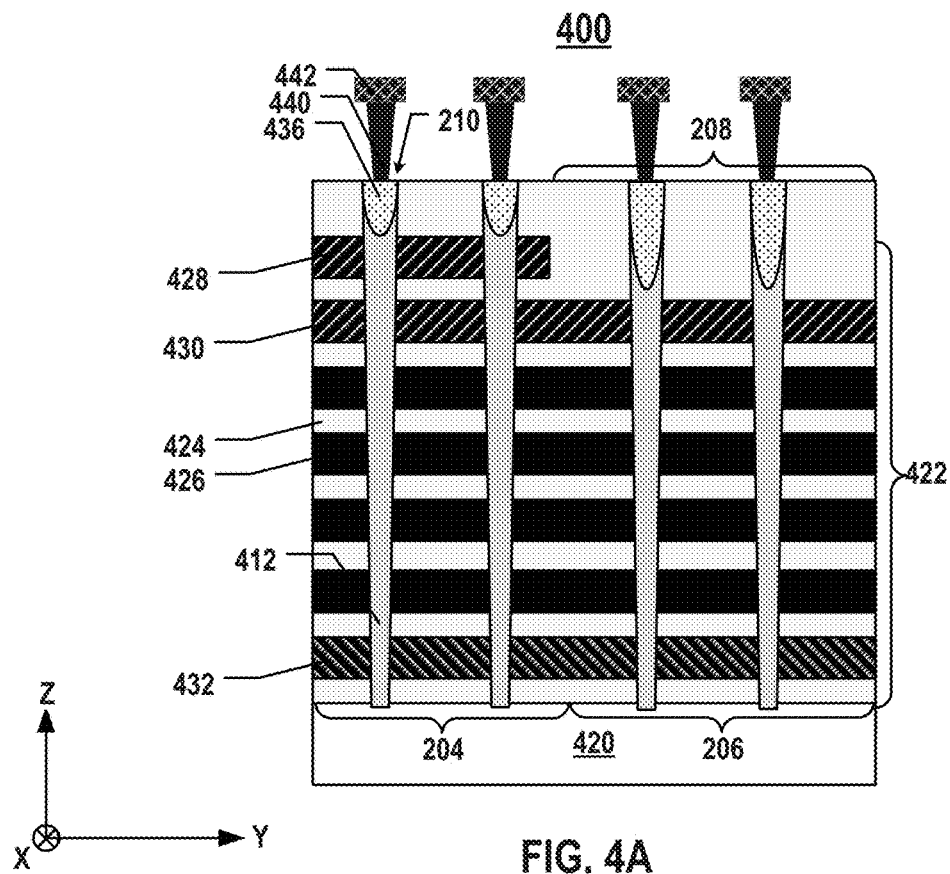
FIG. 4A illustrates a side view of a cross-section of still another exemplary 3D memory device with DSG cut, according to some embodiments of the present disclosure.

FIG. 4A illustrates a side view of a cross-section of still another exemplary 3D memory device 400 with DSG cut, according to some embodiments of the present disclosure. FIG. 4A may be another example showing the side view of the cross-section of 3D memory device 200 along the BB plane in FIG. 2A. That is, FIG. 4A shows the side view of a minimum repeating unit of a memory stack 422 in 3D memory device 400 that is the same as minimum repeating unit 202 in FIG. 2A. It is understood that the details of similar structures (e.g., materials, fabrication process, functions, etc.) in both 3D memory devices 200 and 400 may not be repeated below.

3D memory device 400 can include a substrate 420 and memory stack 422 above substrate 420. In some embodiments, 3D memory device 400 is a NAND Flash memory device in which memory cells are provided in the form of an array of NAND memory strings 210 each extending vertically through memory stack 422 above substrate 420. The array of memory strings 210 can be divided into non-DSG cut region 204 and DSG cut region 206 of memory stack 422 in the plan view. In some embodiments, the size of non-DSG cut region 204 is nominally the same as the size of DSG cut region 206, and the number of memory strings 210 in non-DSG cut region 204 is nominally the same as the number of memory strings 210 in DSG cut region 206. In other words, memory strings 210 can be evenly divided into regions 204 and 206 (i.e., minimum repeating unit 202) of memory stack 422.

Memory stack 422 includes vertically interleaved conductive layers 426 and dielectric layers 424 in the z-direction, according to some embodiments. In some embodiments, the outermost ones of conductive layers 426 include a plurality of DSG lines 428 and 430 and an SSG line 432. The rest of conductive layer 426 vertically between SSG line 432 and DSG lines 428 and 430 can include gate lines surrounding memory strings 210 and extending laterally as word lines. DSG line 428 is the first uppermost conductive layer 426, DSG line 430 is the second uppermost conductive layer 426, and SSG line 432 is the lowermost conductive layer 426, according to some embodiments. In some embodiments, each memory string 210 abuts at least one of DSG lines 428 and 430, which are configured to control the drains of memory strings 210. Each memory string 210 in non-DSG cut region 204 abuts both DSG lines 428 and 430, such that the drain of memory string 210 in non-DSG cut region 204 is controlled by both DSG lines 428 and 430, according to some embodiments. Each memory string 210 in DSG cut region 206 abuts DSG line 430, but not DSG line 428 due to DSG cut 208, such that the drain of memory string 210 in DSG cut region 206 is controlled by DSG line 430, but not DSG line 428.

As shown in FIG. 4A, a portion of DSG line 428 (e.g., the first uppermost conductive layer 426) in DSG cut region 206 is removed by DSG cut 208. That is, DSG lines 428 and 430 can have different lateral dimensions, for example, in the y-direction (the bit line direction). As a result, in some embodiments, the numbers of DSG lines 428 and 430 are different between DSG cut and non-DSG cut regions 206 and 204 due to DSG cut 208. For example, there may be two DSG lines 428 and 430 in non-DSG cut region 204, but only one DSG line 430 in DSG cut region 206. In other words, the numbers of DSG lines 428 and 430 through which memory strings 210 extend vertically are different between DSG cut and non-DSG cut regions 206 and 204. For example, memory strings 210 in non-DSG cut region 204 extend vertically through two DSG lines 428 and 430, while memory strings 210 in DSG cut region 206 extend vertically through only one DSG line 430. The layout and design of 3D memory device 400 avoid any dummy memory strings (e.g., shown in FIGS. 1A and 1B) due to DSG cut. For example, DSG cut region 206 of 3D memory device 400 may be free of dummy memory strings, and each memory string 210 in minimum repeating unit 202 of memory stack 422 may be functional memory strings. Thus, the effective device area and memory cell density of 3D memory device 400 can be increased, and the electrical performance can be improved, compared with 3D memory device 100.

Different from 3D memory device 200 in FIG. 2B in which memory strings 210 in DSG cut region 206 and non-DSG cut region 204 have different heights, each memory string 210 in DSG cut region 206 and non-DSG cut region 204 in 3D memory device 400 in FIG. 4A have nominally the same height, according to some embodiments. For example, the upper ends of memory strings 210 in both non-DSG cut region 204 and DSG cut region 206 may be above DSG line 428 (e.g., the first uppermost conductive layer 426). In some embodiments, the upper ends of memory strings 210 in both non-DSG cut region 204 and DSG cut region 206 are flush with one another. As described below with respect to the fabrication processes, by making each memory string 210 in minimum repeating unit 202 of memory stack 422 with uniform height, the fabrication complexity can be reduced.

Memory string 210 can include a channel structure 412 and a channel plug 436 at the upper end of memory string 210. In some embodiments, channel plugs 436 in non-DSG cut region 204 have nominally the same height, and channel plugs 436 in DSG cut region 206 have nominally the same height. The heights of channel plugs 436 are different between non-DSG cut region 204 and DSG cut region 206, according to some embodiments. For example, the height of each channel plug 436 in DSG cut region 206 may be greater than the height of each channel plug 436 in non-DSG cut region 204. For example, the lower ends of channel plugs 436 in non-DSG cut region 204 may be above DSG line 428 (e.g., the first uppermost conductive layer 426), and the lower ends of channel plugs 436 in DSG cut region 206 may be between DSG line 430 (e.g., the second uppermost conductive layer 426) and DSG lines 428 in the vertical direction.

3D memory device 400 also includes bit line contacts 440 each above and in contact with a respective one of memory string 210 in minimum repeating unit 202 of memory stack 422. In some embodiments, each bit line contact 440 is formed on top of the upper end of a respective memory string 210 (i.e., channel plug 436). As the upper ends of memory strings 210 in each region 204 or 206 are flush with one another, the height of each bit line contact 440 in minimum repeating unit 202 is normally the same, according to some embodiments. As described below with respect to the fabrication processes, by making each bit line contact 440 in minimum repeating unit 202 of memory stack 422 with uniform height, the fabrication complexity can be reduced. 3D memory device 400 can further include bit lines 442 each above and in contact with a respective one of bit line contacts 440 in minimum repeating unit 202 of memory stack 422.

Figure 4B:
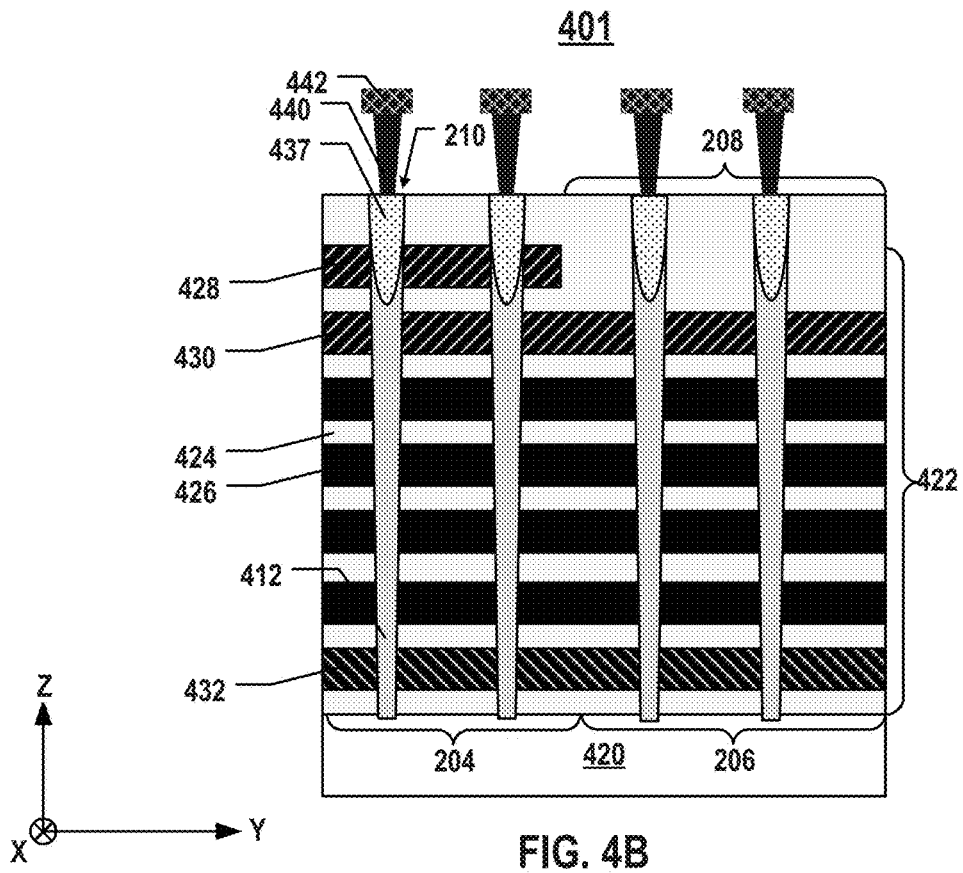
FIG. 4B illustrates a side view of a cross-section of yet another exemplary 3D memory device with DSG cut, according to some embodiments of the present disclosure.

Although channel plugs 436 of 3D memory device 400 in FIG. 4A have different heights between non-DSG cut region 204 and DSG cut region 206, it is understood that in some examples, the channel plugs may have nominally the same height among different regions. For example, FIG. 4B illustrates a side view of a cross-section of still another exemplary 3D memory device 401 with DSG cut, according to some embodiments of the present disclosure. FIG. 4B may be still another example showing the side view of the cross-section of 3D memory device 200 along the BB plane in FIG. 2A. As shown in FIG. 4B, the heights of channel plugs 437 are nominally the same among different regions, e.g., between non-DSG cut region 204 and DSG cut region 206, according to some embodiments. That is, each channel plug 437 in 3D memory device 401 can be nominally the same in minimum repeating unit 202 of memory stack 422. In some embodiments, the lower ends of each channel plug 437 are between DSG line 428 (e.g., the first uppermost conductive layer 426) and DSG line 430 (e.g., the second uppermost conductive layer 426). It is understood that the details of other same structures in both 3D memory devices 400 and 401 are not repeated for ease of description.

Figure 5A:
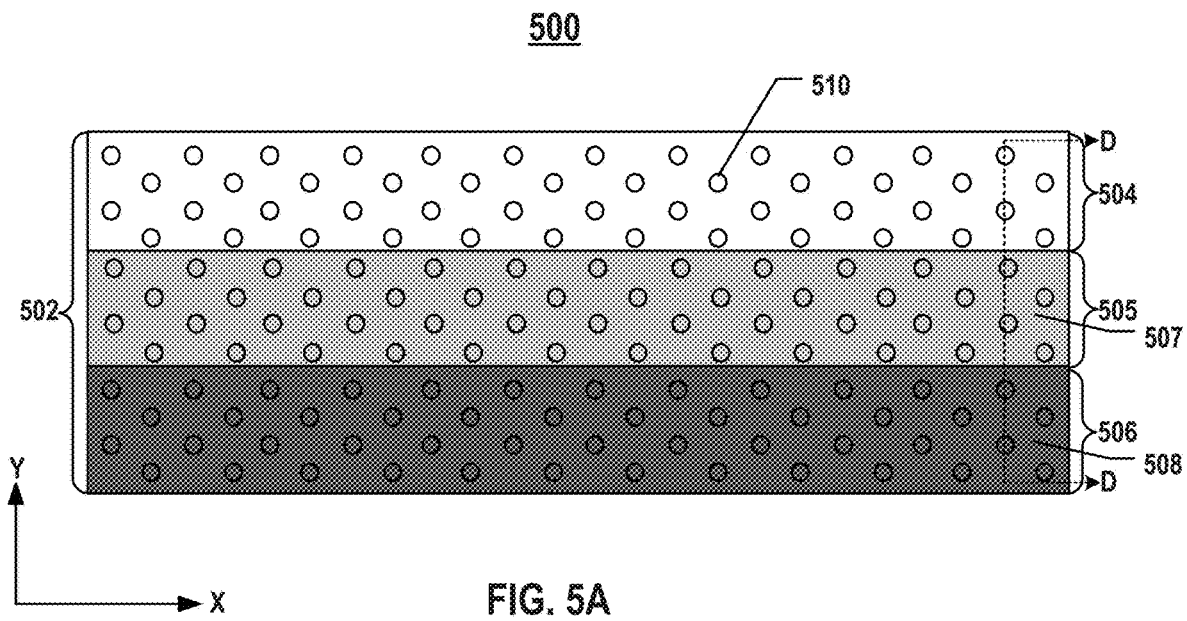
FIGS. 5A and 5B illustrate a plan view and a side view of a cross-section of yet another exemplary 3D memory device with DSG cut, according to some embodiments of the present disclosure.
Figure 5B:
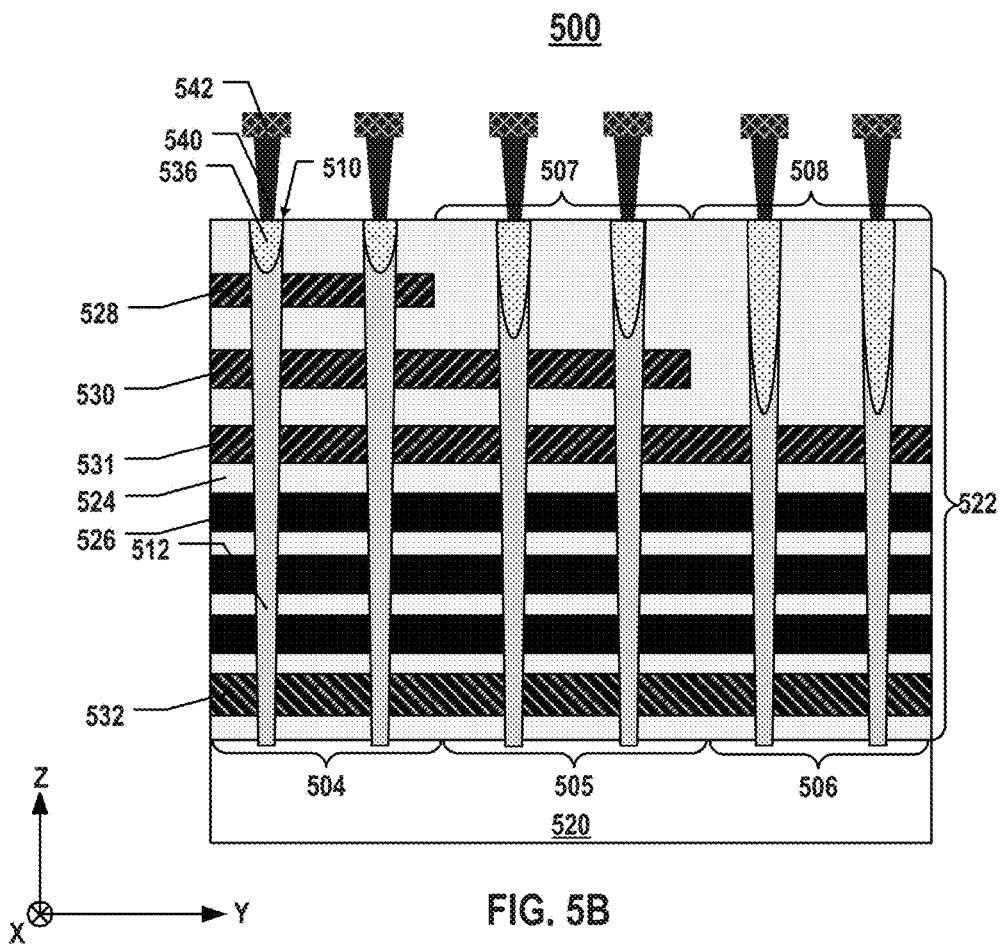

It is understood that the number of regions in the minimum repeating unit of the memory stack of a 3D memory device is not limited to 2 (e.g., one DSG cut region 206 and one non-DSG cut region 204 in minimum repeating unit 202), and may be any other suitable number, such as 3 or more. For example, FIGS. 5A and 5B illustrate a plan view and a side view of a cross-section of yet another exemplary 3D memory device 500 with DSG cut, according to some embodiments of the present disclosure. FIG. 5B shows the side view of the cross-section of 3D memory device 500 along the DD plane in FIG. 5A. As shown in FIG. 5A, a minimum repeating unit 502 of 3D memory device 500 includes three regions: a non-DSG cut region 504 and two DSG cut regions 505 and 506 in the y-direction (the bit line direction) in the plan view. It is understood that the details of similar structures (e.g., materials, fabrication process, functions, etc.) in both 3D memory devices 400 and 500 may not be repeated below.

As shown in FIG. 5B, 3D memory device 500 can include a substrate 520 and a memory stack 522 above substrate 520. In some embodiments, 3D memory device 500 is a NAND Flash memory device in which memory cells are provided in the form of an array of NAND memory strings 510 each extending vertically through memory stack 522 above substrate 520, as shown in the side view of FIG. 5B. The array of memory strings 510 can be divided into regions 504, 505, and 506 of memory stack 522. In some embodiments, the size of each region 504, 505, or 506 is nominally the same, and the number of memory strings 510 in each region 504, 505, or 506 is nominally the same. In other words, memory strings 510 can be evenly divided into regions 504, 505, or 506 (i.e., minimum repeating unit 502) of memory stack 522.

Memory stack 522 includes vertically interleaved conductive layers 526 and dielectric layers 524 in the z-direction, according to some embodiments. In some embodiments, the outermost ones of conductive layers 526 include a plurality of DSG lines 528, 530, and 531 and an SSG line 532. The rest of conductive layer 526 vertically between SSG line 532 and DSG lines 528, 530, and 531 can include gate lines surrounding memory strings 510 and extending laterally as word lines. As shown in FIG. 5B, DSG line 528 is the first uppermost conductive layer 526, DSG line 530 is the second uppermost conductive layer 526, and DSG line 531 is the third uppermost conductive layer 526, according to some embodiments. In some embodiments, each memory string 510 abuts at least one of DSG lines 528, 530, and 531, which are configured to control the drains of memory strings 510. Each memory string 510 in non-DSG cut region 504 abuts DSG lines 528, 530, and 531, such that the drain of memory string 510 in non-DSG cut region 504 is controlled by three DSG lines 528, 530, and 531, according to some embodiments. Each memory string 510 in DSG cut region 505 abuts DSG lines 530 and 531, but not DSG line 528 due to DSG cut 507, such that the drain of memory string 510 in DSG cut region 505 is controlled by two DSG lines 530 and 531, but not DSG line 528. Each memory string 510 in DSG cut region 506 abuts DSG line 531, but not DSG lines 528 and 530 due to DSG cuts 507 and 508, such that the drain of memory string 510 in DSG cut region 506 is controlled by DSG line 531, but not DSG lines 528 and 530.

In some embodiments, a portion of DSG line 528 (e.g., the first uppermost conductive layer 526) in DSG cut regions 505 and 506 is removed by DSG cuts 507 and 508, and a portion of DSG line 530 (e.g., the second uppermost conductive layer 526) in DSG cut region 506 is removed by DSG cut 508 That is, DSG lines 528, 530, and 531 can have different lateral dimensions, for example, in the y-direction (the bit line direction). DSG lines 528, 530, and 531 form a staircase structure, according to some embodiments. As a result, in some embodiments, the numbers of DSG lines 528, 530, and 531 are different among regions 504, 505, and 506 due to DSG cuts 507 and 508. For example, there may be three DSG lines 528, 530, and 531 in non-DSG cut region 504, two DSG lines 530 and 531 in DSG cut region 505, and one DSG line 531 in DSG cut region 506. In other words, the numbers of DSG lines 528, 530, and 531 through which memory strings 510 extend vertically are different among regions 504, 505, and 506. The layout and design of 3D memory device 500 avoid any dummy memory strings (e.g., shown in FIGS. 1A and 1B) due to DSG cut. For example, DSG cut regions 505 and 506 of 3D memory device 500 may be free of dummy memory strings, and each memory string 510 in minimum repeating unit 502 of memory stack 522 may be functional memory strings. Thus, the effective device area and memory cell density of 3D memory device 500 can be increased, and the electrical performance can be improved, compared with 3D memory device 100.

As shown in FIG. 5B, memory string 510 can include a channel structure 512 and a channel plug 536 at the upper end of memory string 510. 3D memory device 500 can also include bit line contacts 540 each above and in contact with a respective one of memory string 510 in minimum repeating unit 502 of memory stack 522. In some embodiments, each bit line contact 540 is formed on top of the upper end of a respective memory string 510 (i.e., channel plug 536). 3D memory device 500 can further include bit lines 542 each above and in contact with a respective one of bit line contacts 540 in minimum repeating unit 502 of memory stack 522. It is understood that the number of DSG cut and the number of the resulting DSG regions are not limited by the examples of 3D memory devices 400 and 500 described above, and the number of regions in the minimum repeating unit may be more than 3. For example, more than two uppermost conductive layers may be cut by more than two DSG cuts to form more than three DSG lines in the y-direction (the bit line direction), and the staircase structure formed by the DSG lines may be extended.

Figure 8:
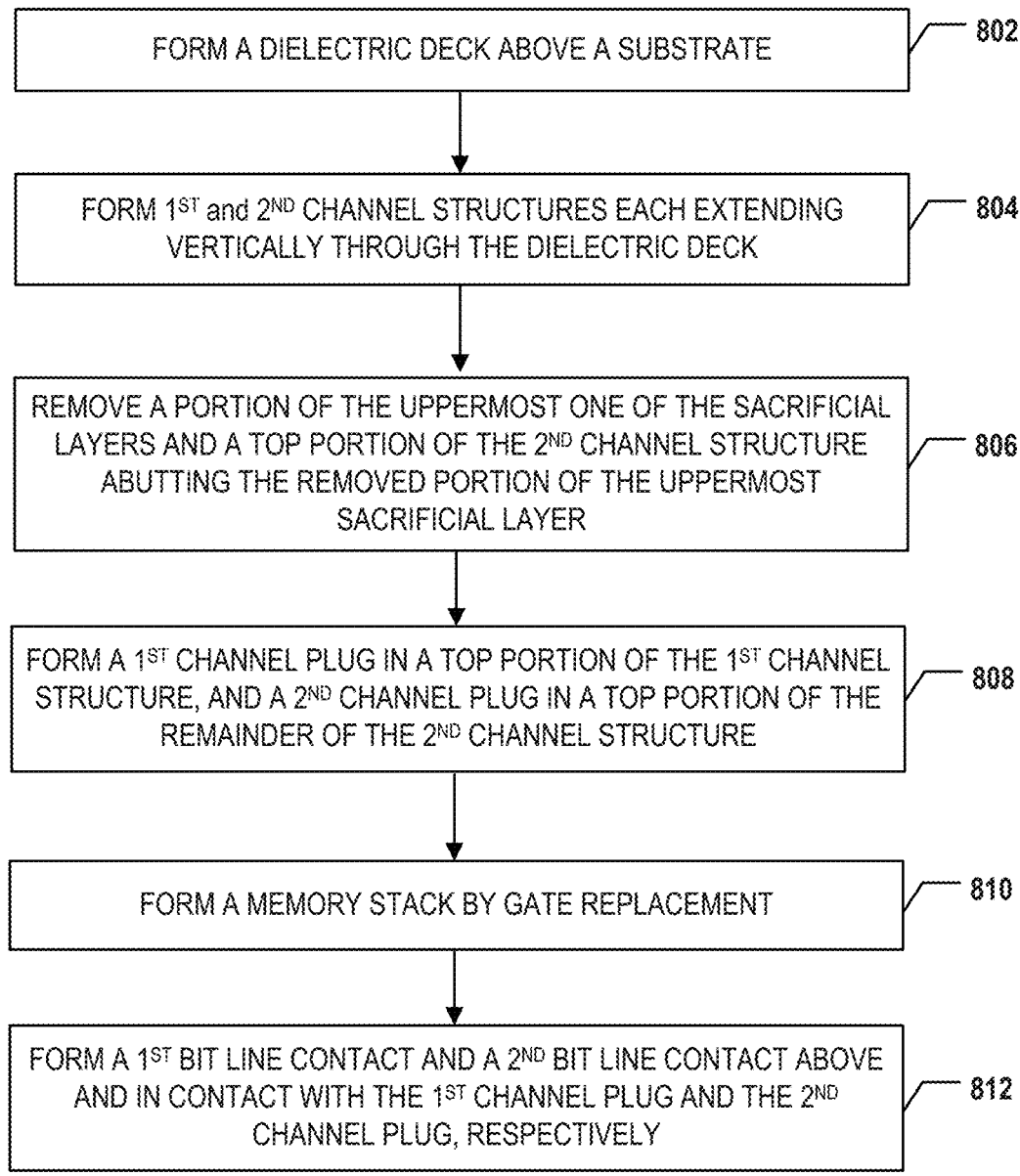
FIG. 8 illustrates a flowchart of a method for forming an exemplary 3D memory device with DSG cut, according to some embodiments of the present disclosure.

FIGS. 6A-6F illustrate a fabrication process for forming an exemplary 3D memory device with DSG cut, according to some embodiments of the present disclosure. FIG. 8 illustrates a flowchart of a method 800 for forming an exemplary 3D memory device with DSG cut, according to some embodiments of the present disclosure. Examples of the 3D memory device depicted in FIGS. 6A-6F and 8 include 3D memory device 200 depicted in FIGS. 2A and 2B. FIGS. 6A-6F and 8 will be described together. It is understood that the operations shown in method 800 are not exhaustive and that other operations can be performed as well before, after, or between any of the illustrated operations. Further, some of the operations may be performed simultaneously, or in a different order than shown in FIG. 8.

Figure 6A:
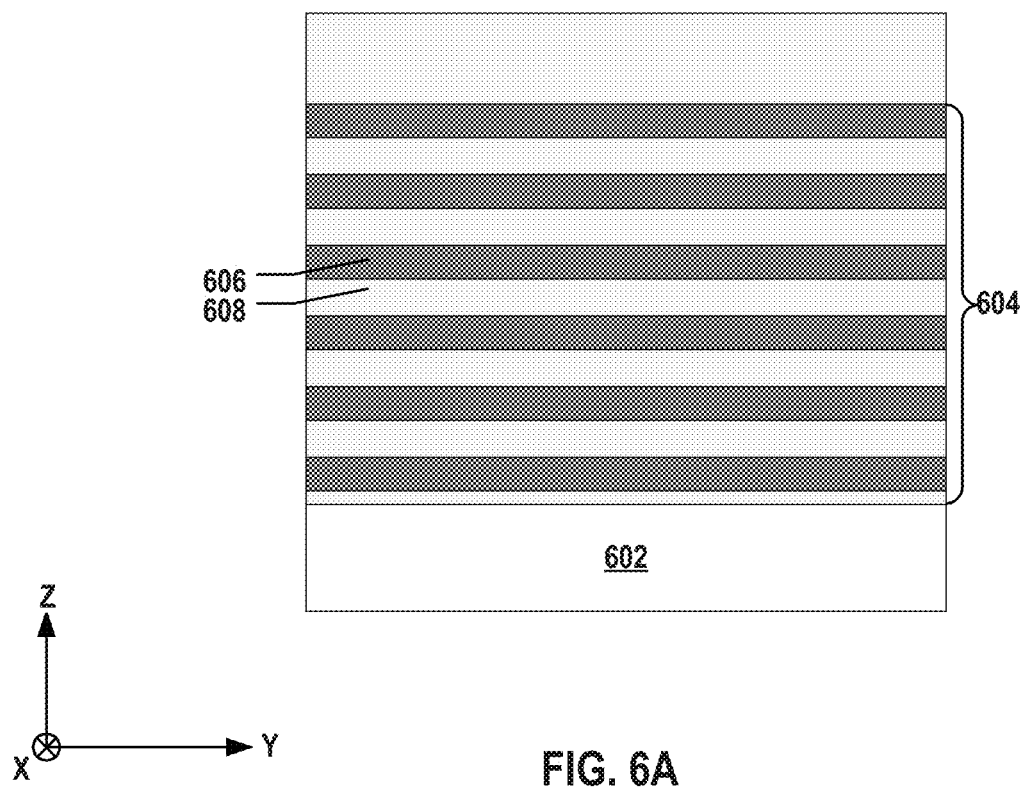
FIGS. 6A-6F illustrate a fabrication process for forming an exemplary 3D memory device with DSG cut, according to some embodiments of the present disclosure.

Referring to FIG. 8, method 800 starts at operation 802, in which a dielectric stack including interleaved sacrificial layers and dielectric layers above a substrate is formed. The substrate can be a silicon substrate. Referring to FIG. 6A, a dielectric stack 604 including a plurality pairs of a sacrificial layer 606 and a dielectric layer 608 is formed above a silicon substrate 602. Dielectric stack 604 includes interleaved sacrificial layers 606 and dielectric layers 608, according to some embodiments. Dielectric layers 608 and sacrificial layers 606 can be alternatingly deposited on silicon substrate 602 to form dielectric stack 604. In some embodiments, each dielectric layer 608 includes a layer of silicon oxide, and each sacrificial layer 606 includes a layer of silicon nitride. That is, a plurality of silicon nitride layers and a plurality of silicon oxide layers can be alternatingly deposited above silicon substrate 602 to form dielectric stack 604. Dielectric stack 604 can be formed by one or more thin film deposition processes including, but not limited to, chemical vapor deposition (CVD), physical vapor deposition (PVD), atomic layer deposition (ALD), or any combination thereof.

Figure 6B:
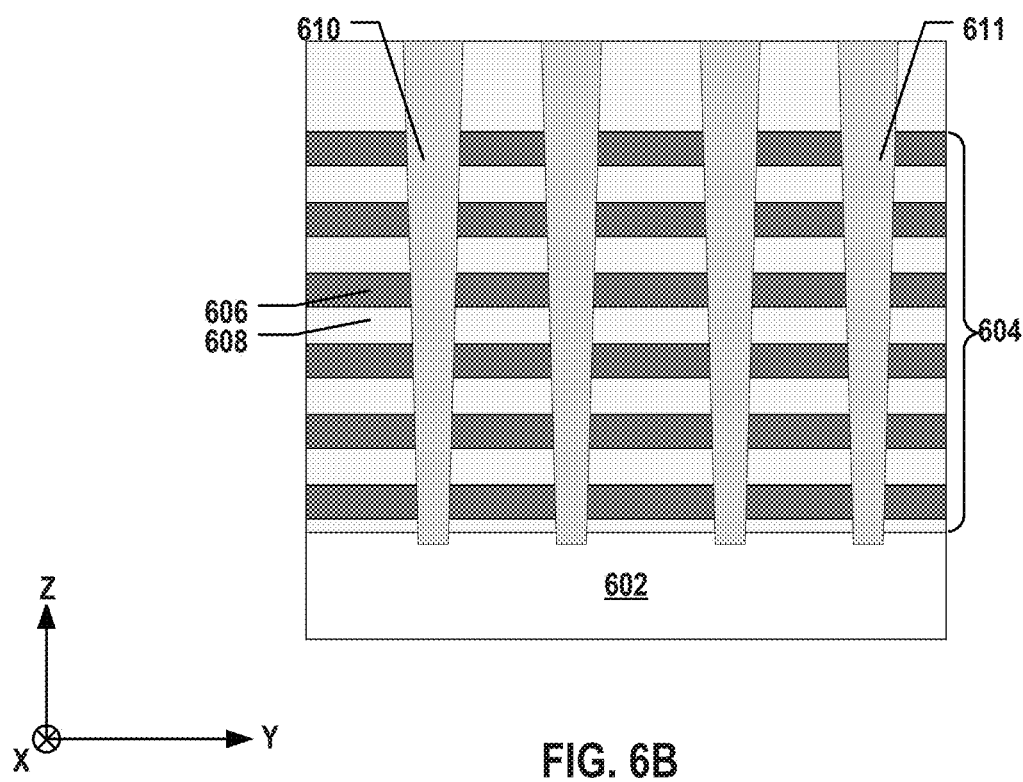

Method 800 proceeds to operation 804, as illustrated in FIG. 8, in which a first channel structure and a second channel structure each extending vertically through the dielectric stack are formed. As illustrated in FIG. 6B, a channel hole is an opening extending vertically through dielectric stack 604. In some embodiments, a plurality of openings are formed through dielectric stack 604 such that each opening becomes the location for growing an individual channel structure 610 or 611 in the later process. In some embodiments, fabrication processes for forming the channel hole of channel structure 610 or 611 include wet etching and/or dry etching, such as deep ion reactive etching (DRIE). In some embodiments, the channel hole of each channel structure 610 or 611 extends further through the top portion of silicon substrate 602. The etching process through dielectric stack 604 may not stop at the top surface of silicon substrate 602 and may continue to etch part of silicon substrate 602. A memory film (including a blocking layer, a storage layer, and a tunneling layer, not shown) and a semiconductor channel are formed along the sidewall of the channel hole of each channel structure 610 or 611. In some embodiments, the memory film is first deposited along the sidewall of the channel hole, and the semiconductor channel is then deposited over the memory film. The blocking layer, storage layer, and tunneling layer can be sequentially deposited in this order using one or more thin film deposition processes, such as ALD, CVD, PVD, any other suitable processes, or any combination thereof, to form the memory film. The semiconductor channel can then be formed by depositing polysilicon on the tunneling layer using one or more thin film deposition processes, such as ALD, CVD, PVD, any other suitable processes, or any combination thereof.

Method 800 proceeds to operation 806, as illustrated in FIG. 8, in which a portion of the uppermost one of the sacrificial layers and a top portion of the second channel structure abutting the removed portion of the uppermost sacrificial layer are removed, such that the first channel structure extends vertically through a first region of the dielectric stack including the remainder of the uppermost sacrificial layer, and the remainder of the second channel structure extends vertically through a second region of the dielectric stack free of the uppermost sacrificial layer.

Figure 6C:
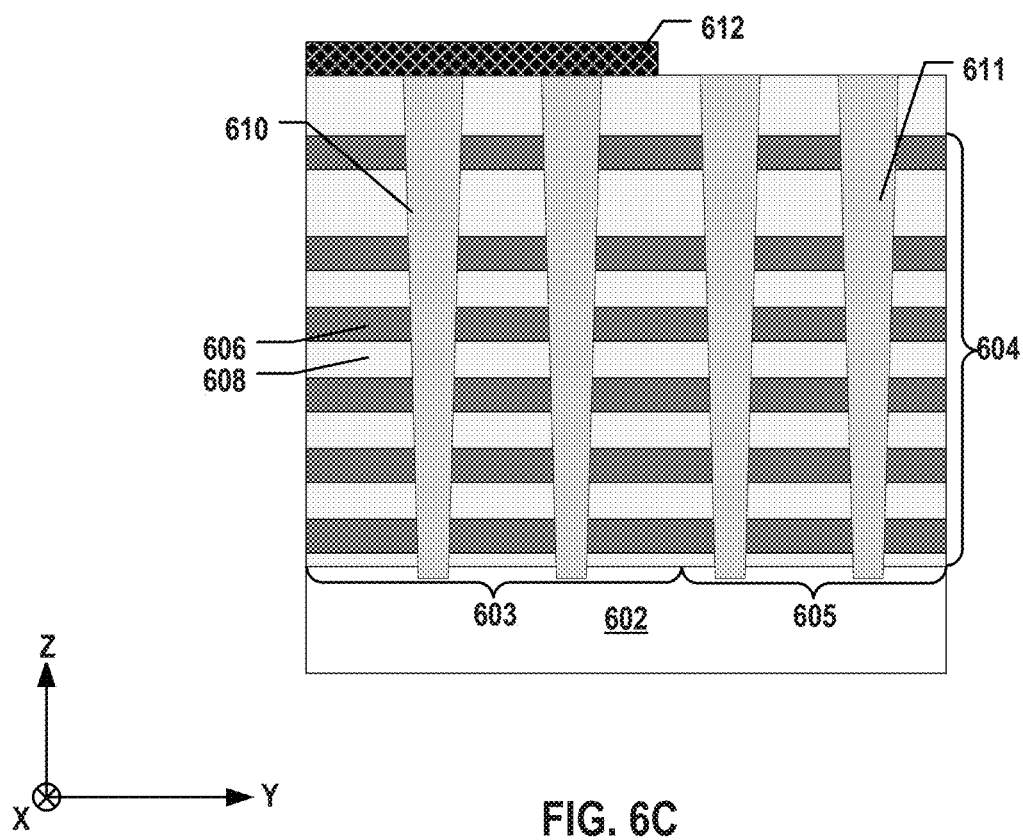

As illustrated in FIG. 6C, an etching mask 612 is patterned to cover a portion of dielectric stack 604 and a portion of the first uppermost sacrificial layer 606 and channel structures 610 underneath. Etching mask 612 can include a soft etching mask (e.g., a photoresist layer) and/or a hard etching mask (e.g., a metal layer) formed on part of dielectric stack 604. In some embodiments, the fabrication processes for patterning etching mask 612 include lithography, development, dry etching, and/or wet etching. By patterning etching mask 612, dielectric stack 604 can be laterally divided into a non-DSG cut region 603 covered by etching mask 612 and a DSG cut region 605 uncovered by etching mask 612 in the y-direction (e.g., the bit line direction). Channel structures 610 and 611 are thus divided into non-DSG cut region 603 and DSG cut region 605, respectively, according to some embodiments.

Figure 6D:
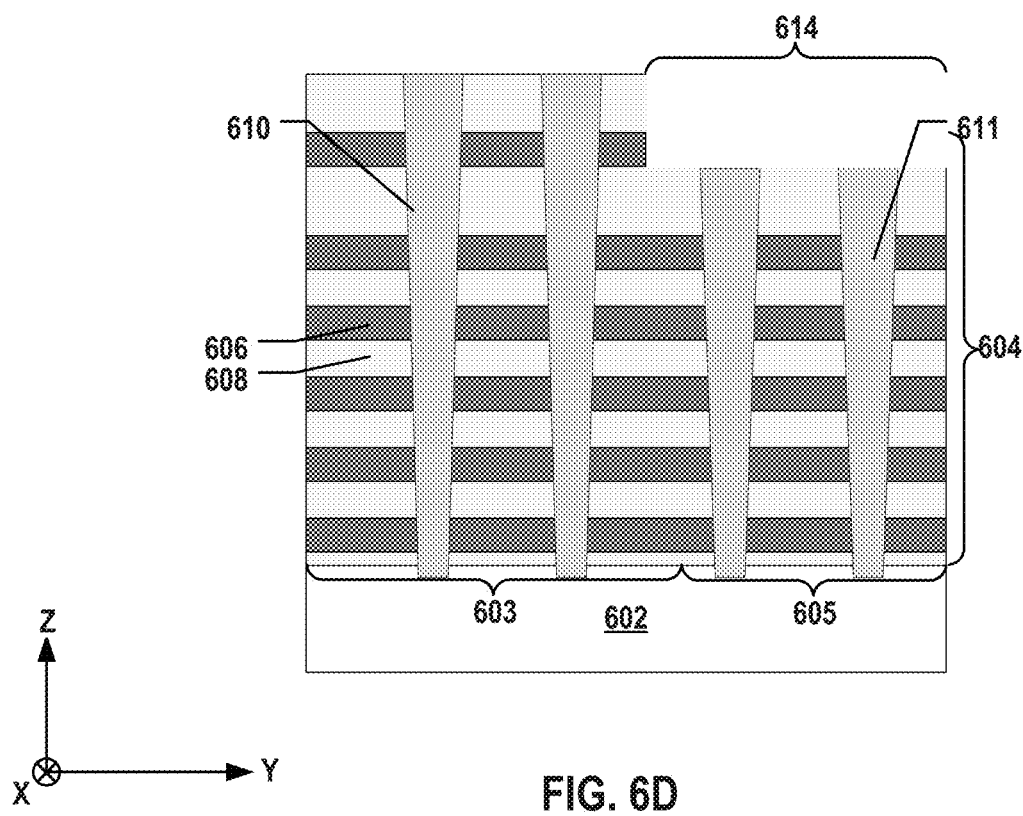

As illustrated in FIG. 6D, a portion of the first uppermost sacrificial layer 606 uncovered by etching mask 612 (shown in FIG. 6C) and a portion of channel structure 611 abutting the removed portion of the first uppermost sacrificial layer 606 in DSG cut region 605 are removed by wet etching and/or dry etching, such as RIE. The etching can be stopped between the first and second uppermost sacrificial layers 606, such that the upper end of channel structure 611 is above second uppermost sacrificial layers 606. The etching can be controlled by controlling the etching rate and/or etching time or be stopped when the first uppermost sacrificial layer 606 (including silicon nitride) is etched. The remainder of the first uppermost sacrificial layer 606 and channel structures 610 in non-DSG cut region 603 can remain intact due to the protection of etching mask 612. DSG cut 614 is thereby formed in DSG cut region 605, according to some embodiments. Etching mask 612 then can be removed using ashing, wet etching, and/or dry etching after the formation of DSG cut 614.

Method 800 proceeds to operation 808, as illustrated in FIG. 8, in which a first channel plug in a top portion of the first channel structure, and a second channel plug in a top portion of the remainder of the second channel structure are formed. In some embodiments, the lower end of the first channel plug is higher than the remainder of the uppermost sacrificial layer, and the upper end of the second channel plug is lower than the remainder of the uppermost sacrificial layer.

Figure 6E:
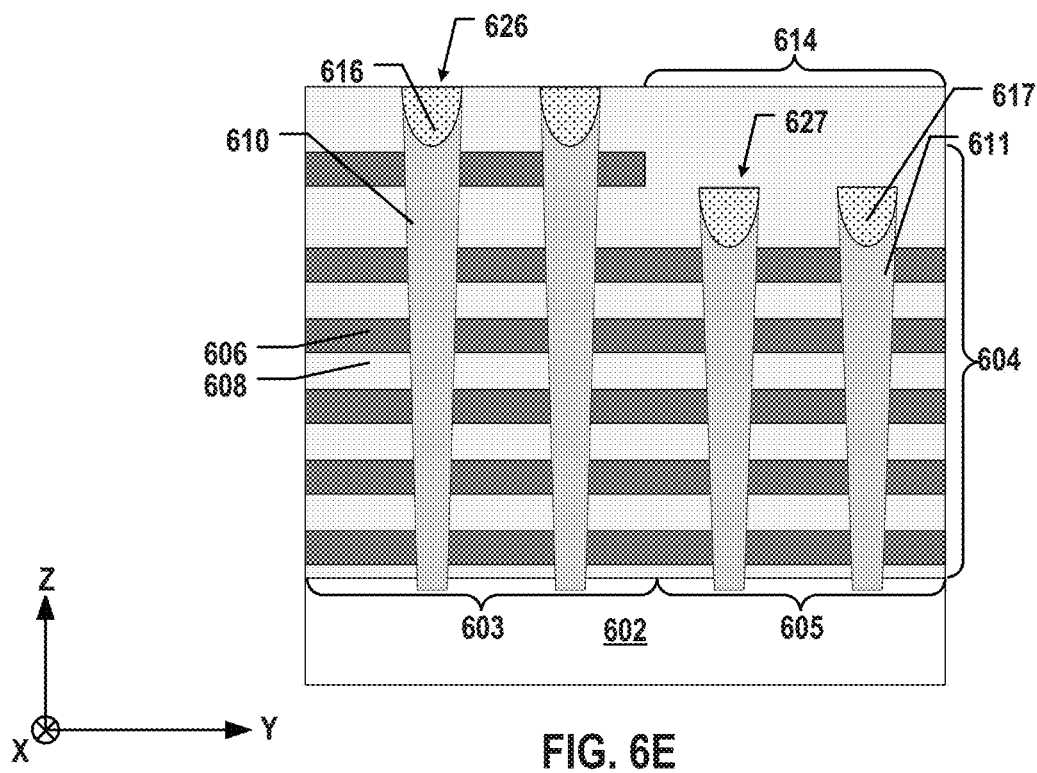

As illustrated in FIG. 6E, a channel plug 616 is formed in the top portion of channel structure 610 in non-DSG cut region 603, and a channel plug 617 is formed in the top portion of the remainder of channel structure 611 in DSG cut region 605. In some embodiments, a recess is formed in the top portion of channel structure 610 or 611 by wet etching and/or drying etching parts of the memory film, semiconductor channel, and capping layer in the top portion of channel structure 610 or 611. Channel plugs 616 and 617 then can be formed by depositing semiconductor materials, such as polysilicon, into the recesses by one or more thin film deposition processes, such as CVD, PVD, ALD, or any combination thereof. Memory strings 626 each including a respective channel structure 610 and channel plug 616 are thereby formed through dielectric stack 604 including the remainder of the first uppermost sacrificial layer 606 in non-DSG cut region 603. Memory strings 627 each including a respective channel structure 611 and channel plug 617 are thereby formed through dielectric stack 604 free of the first uppermost sacrificial layer 606 in DSG cut region 605. In some embodiments, the removed top portion of dielectric stack 604 in DSG cut region 605 (shown in FIG. 6D) is filled again with a dielectric material, such as silicon oxide, using one or more thin film deposition processes, such as CVD, PVD, ALD, or any combination thereof, followed by a planarization process, such as CMP.

Figure 6F:
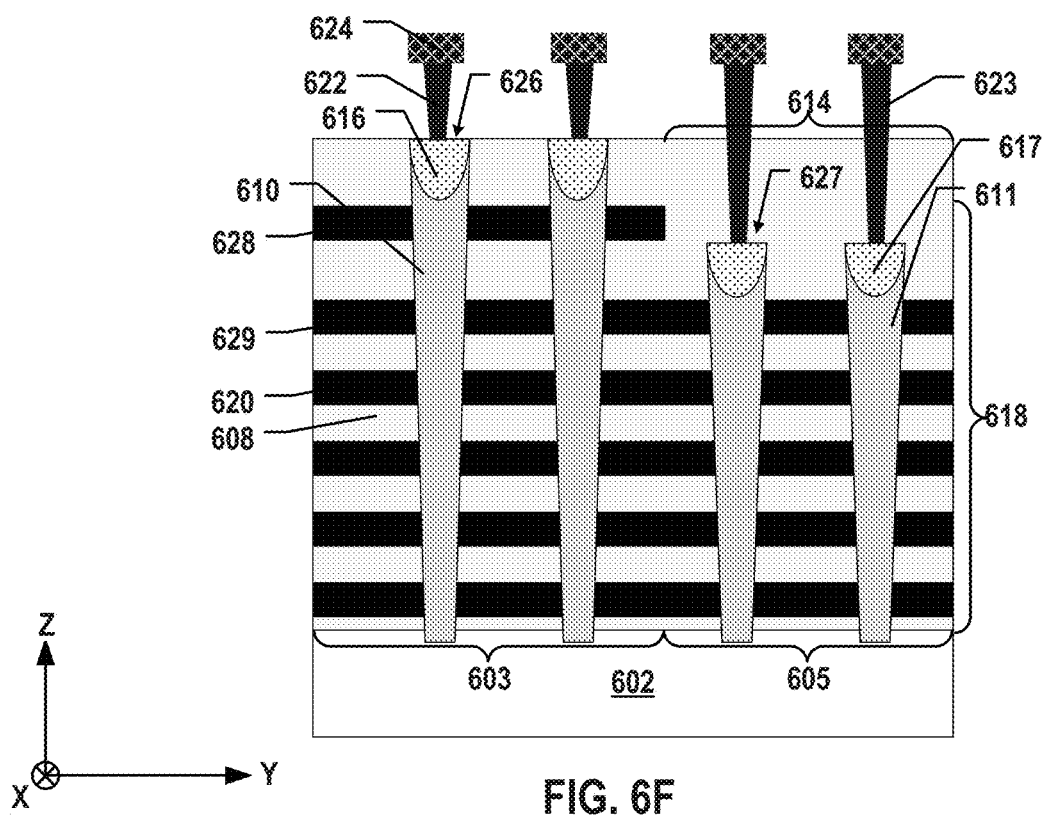

Method 800 proceeds to operation 810, as illustrated in FIG. 8, in which a memory stack including interleaved conductive layers and the dielectric layers is formed by replacing the sacrificial layers of the dielectric stack with the conductive layers (i.e., the so-called "gate replacement" process). As illustrated in FIG. 6F, sacrificial layers 606 (shown in FIG. 6E) are replaced with conductive layers 620, and a memory stack 618 including interleaved conductive layers 620 and dielectric layers 608 is thereby formed. In some embodiments, lateral recesses (not shown) are first formed by removing sacrificial layers 606 through a slit opening (not shown). In some embodiments, sacrificial layers 606 are removed by applying etching solutions through the slit opening, such that sacrificial layers 606 are removed, creating the lateral recesses interleaved between dielectric layers 608. The etching solutions can include any suitable etchants that etch sacrificial layers 606 selective to dielectric layers 608. As illustrated in FIG. 6F, conductive layers 620 are deposited into the lateral recesses through the slit opening. In some embodiments, gate dielectric layers (not shown) are deposited into the lateral recesses prior to conductive layers 620, such that conductive layers 620 are deposited on the gate dielectric layers. Conductive layers 620, such as metal layers, can be deposited using one or more thin film deposition processes, such as ALD, CVD, PVD, any other suitable processes, or any combination thereof. DSG lines 628 and 629 are thereby formed, replacing the remainder of the first uppermost sacrificial layer 606 and the second uppermost sacrificial layer 606, respectively, according to some embodiments.

Method 800 proceeds to operation 812, as illustrated in FIG. 8, in which a first bit line contact and a second bit line contact are formed above and in contact with the first channel plug and the second channel plug, respectively. In some embodiments, a plurality of bit lines are formed above and in contact with the first bit line contact and the second bit line contact, respectively.

As illustrated in FIG. 6F, bit line contacts 622 are formed above and in contact with channel plugs 616 of memory strings 626, respectively, in non-DSG cut region 603, and bit line contacts 623 are formed above and in contact with channel plugs 617 of memory strings 627, respectively, in DSG cut region 605. Due to DSG cut 614, the height of each bit line contact 623 in DSG cut region 605 is greater than the height of each bit line contact 622 in non-DSG cut region 603, according to some embodiments. In some embodiments, to form bit line contacts 622 and 623, bit line contact openings are formed through a dielectric layer on memory stack 618 using wet etching/dry etching, such as RIE. In some embodiments, the etching process stops at the upper ends of channel plugs 616 and 617 of memory strings 626 and 627 to expose the upper end of channel plugs 616 and 617. Bit line contacts 622 and 623 can then be formed by depositing conductive materials into the bit line contact openings using thin film deposition processes, such as ALD, CVD, PVD, any other suitable processes, or any combination thereof, followed by a CMP process.

As illustrated in FIG. 6F, bit lines 624 are formed above and in contact with bit line contacts 622 and 623, respectively, in non-DSG cut region 603 and DSG cut region 605. The height of each bit line 624 is nominally the same, according to some embodiments. In some embodiments, to form bit lines 624, bit line openings are formed through a dielectric layer on bit line contacts 622 and 623 using wet etching/dry etching, such as RIE. In some embodiments, the etching process stops at the upper ends of bit line contacts 622 and 623. Bit lines 624 can then be formed by depositing conductive materials into the bit line openings using thin film deposition processes, such as ALD, CVD, PVD, any other suitable processes, or any combination thereof, followed by a CMP process.

Figure 9:
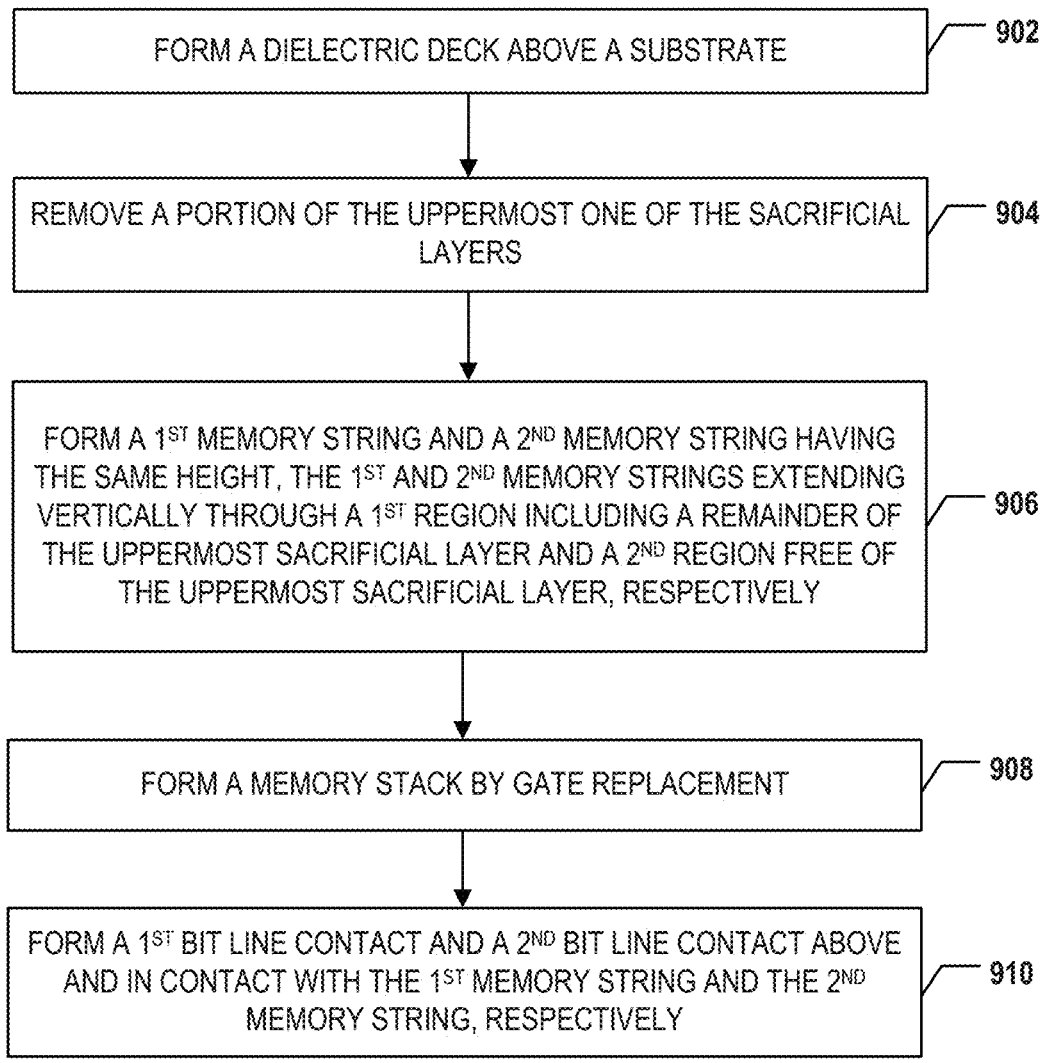
FIG. 9 illustrates a flowchart of a method for forming another exemplary 3D memory device with DSG cut, according to some embodiments of the present disclosure.

FIGS. 7A-7H illustrate a fabrication process for forming other exemplary 3D memory devices with DSG cut, according to some embodiments of the present disclosure. FIG. 9 illustrates a flowchart of a method 900 for forming other exemplary 3D memory devices with DSG cut, according to some embodiments of the present disclosure. Examples of the 3D memory device depicted in FIGS. 7A-7H and H include 3D memory device 400 and 401 depicted in FIGS. 4A and 4B. FIGS. 7A-7H and 9 will be described together. It is understood that the operations shown in method 900 are not exhaustive and that other operations can be performed as well before, after, or between any of the illustrated operations. Further, some of the operations may be performed simultaneously, or in a different order than shown in FIG. 9.

Figure 7A:
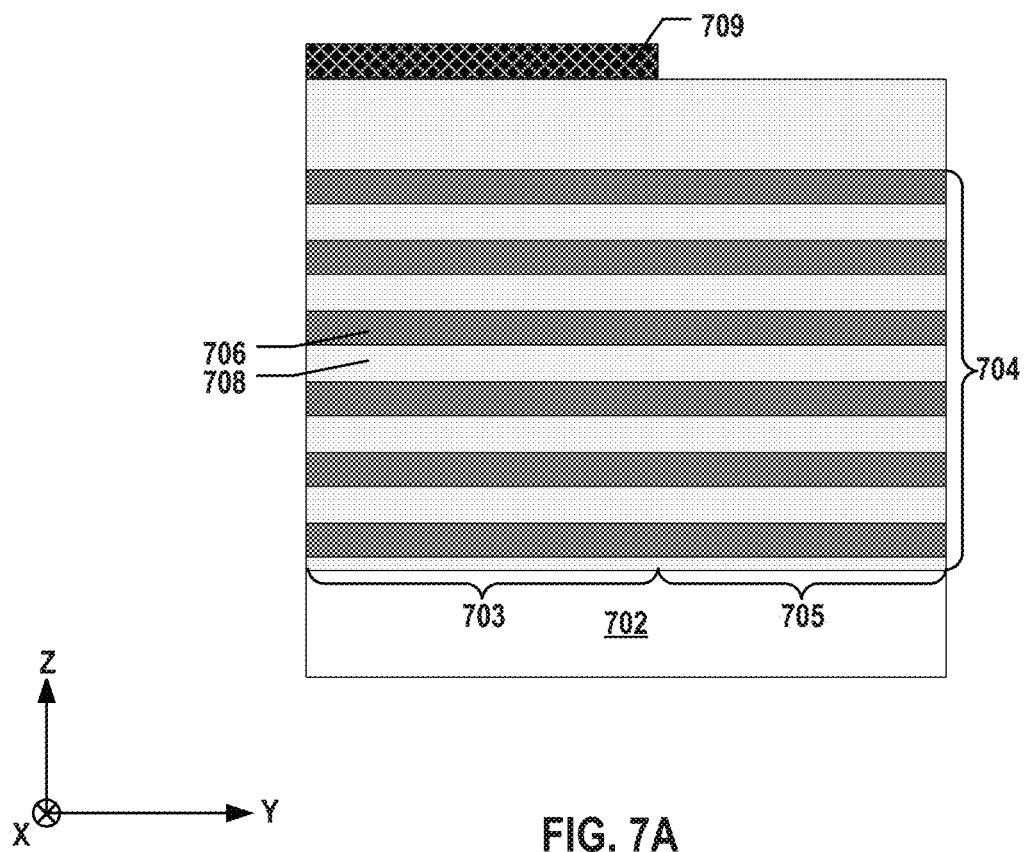
FIGS. 7A-7H illustrate a fabrication process for forming other exemplary 3D memory devices with DSG cut, according to some embodiments of the present disclosure.

Referring to FIG. 9, method 900 starts at operation 902, in which a dielectric stack including interleaved sacrificial layers and dielectric layers above a substrate is formed. The substrate can be a silicon substrate. Referring to FIG. 7A, a dielectric stack 704 including a plurality pairs of a sacrificial layer 706 and a dielectric layer 708 is formed above a silicon substrate 702. Dielectric stack 704 includes interleaved sacrificial layers 706 and dielectric layers 708, according to some embodiments. Dielectric layers 708 and sacrificial layers 706 can be alternatingly deposited on silicon substrate 702 to form dielectric stack 704. In some embodiments, each dielectric layer 708 includes a layer of silicon oxide, and each sacrificial layer 706 includes a layer of silicon nitride. That is, a plurality of silicon nitride layers and a plurality of silicon oxide layers can be alternatingly deposited above silicon substrate 702 to form dielectric stack 704. Dielectric stack 704 can be formed by one or more thin film deposition processes including, but not limited to, CVD, PVD, ALD, or any combination thereof.

Method 900 proceeds to operation 904, as illustrated in FIG. 9, in which a portion of the uppermost one of the sacrificial layers is removed. As illustrated in FIG. 7A, an etching mask 709 is patterned to cover a portion of dielectric stack 704 and a portion of the uppermost sacrificial layer 706 underneath. Etching mask 709 can include a soft etching mask (e.g., a photoresist layer) and/or a hard etching mask (e.g., a metal layer) formed on part of dielectric stack 704. In some embodiments, the fabrication processes for patterning etching mask 709 include lithography, development, dry etching, and/or wet etching. By patterning etching mask 709, dielectric stack 704 can be laterally divided into a non-DSG cut region 703 covered by etching mask 709 and a DSG cut region 705 uncovered by etching mask 709 in the y-direction (e.g., the bit line direction).

Figure 7B:
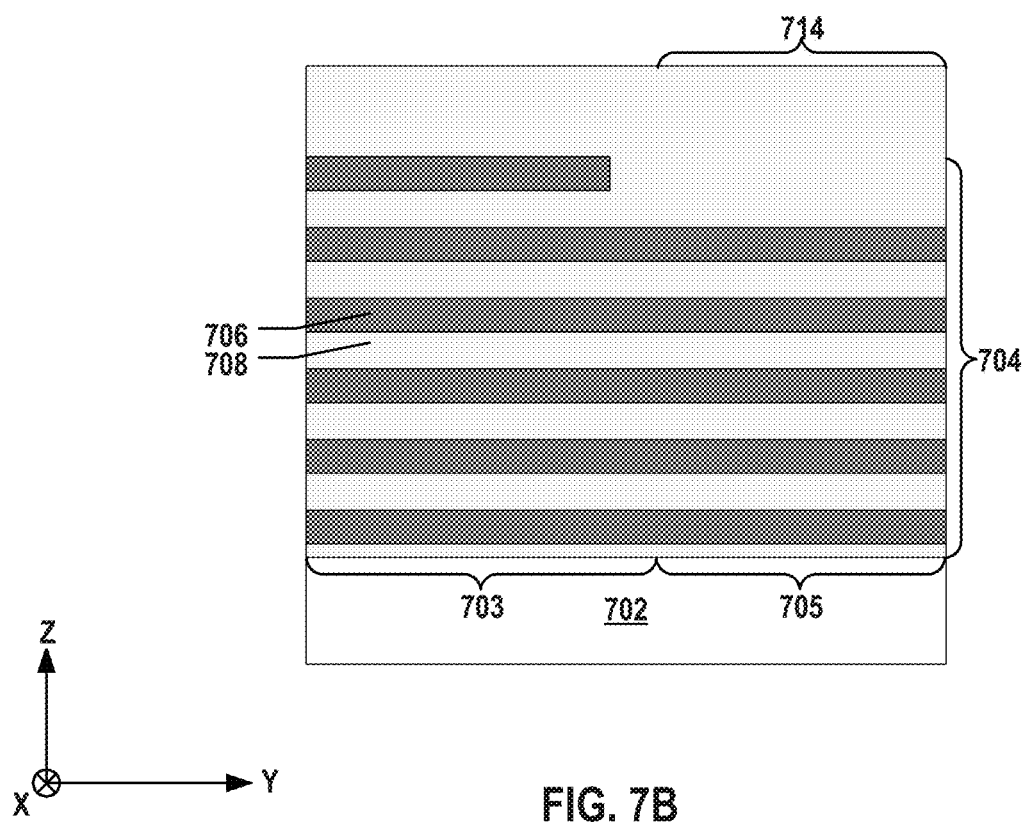

As illustrated in FIG. 7B, a portion of the first uppermost sacrificial layer 706 uncovered by etching mask 709 (shown in FIG. 7A) is removed by wet etching and/or dry etching, such as RIE. The etching can be stopped between the first and second uppermost sacrificial layers 706, such that the second uppermost sacrificial layer 706 remains intact. The etching depth can be controlled by controlling the etching rate and/or etching time. The remainder of the first uppermost sacrificial layer 706 in non-DSG cut region 703 can remain intact due to the protection of etching mask 709. DSG cut 714 is thereby formed in DSG cut region 705, according to some embodiments. Etching mask 709 then can be removed using ashing, wet etching, and/or dry etching after the formation of DSG cut 714. In some embodiments, the removed top portion of dielectric stack 704 in DSG cut region 705 is filled again with a dielectric material, such as silicon oxide, using one or more thin film deposition processes, such as CVD, PVD, ALD, or any combination thereof, followed by a planarization process, such as CMP.

Method 900 proceeds to operation 906, as illustrated in FIG. 9, in which a first memory string and a second memory string each having nominally the same height are formed. In some embodiments, the first memory string extends vertically through a first region of the dielectric stack including the remainder of the uppermost sacrificial layer, and the second memory string extends vertically through a second region of the dielectric stack free of the uppermost sacrificial layer. In some embodiments, to form the first and second memory strings, a first channel structure and a second structure extending vertically through the first region and the second region of the dielectric stack, respectively, are simultaneously formed, an elevating layer is formed on the first region, but not the second region, of the dielectric stack, a first recess through the elevating layer into a top portion of the first channel structure, and a second recess into a top portion of the second channel structure are simultaneously formed, and a first channel plug and a second channel plug are simultaneously formed in the first recess and the second recess, respectively. The depth of the second recess can be nominally the same as the depth of the first recess. In some embodiments, to form the first and second memory strings, the first and second channel plugs are planarized, such that upper ends of the first and second memory strings and the top surface of the dielectric stack are flush with one another. In some embodiments, the height of the second channel plug is greater than the height of the first channel plug after the planarizing. In some embodiments, the lower end of the first channel plug is higher than the remainder of the uppermost sacrificial layer, and the lower end of the second channel plug is lower than the remainder of the uppermost sacrificial layer.

Figure 7C:
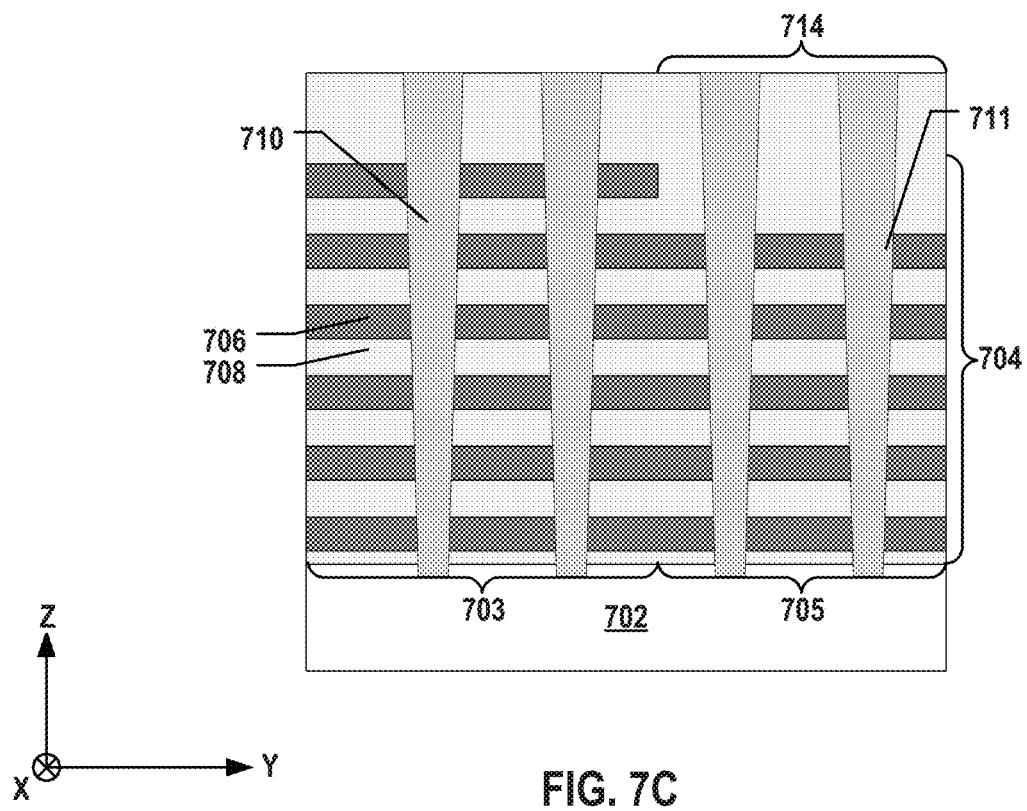

As illustrated in FIG. 7C, a channel hole is an opening extending vertically through dielectric stack 704. In some embodiments, a plurality of openings are formed through dielectric stack 704 such that each opening becomes the location for growing an individual channel structure 710 or 711 in the later process. In some embodiments, fabrication processes for forming the channel hole of channel structure 710 or 711 include wet etching and/or dry etching, such as DRIE. In some embodiments, the channel hole of each channel structure 710 or 711 extends further through the top portion of silicon substrate 702. The etching process through dielectric stack 704 may not stop at the top surface of silicon substrate 702 and may continue to etch part of silicon substrate 702. A memory film (including a blocking layer, a storage layer, and a tunneling layer, not shown) and a semiconductor channel are formed along the sidewall of the channel hole of each channel structure 710 or 711. In some embodiments, the memory film is first deposited along the sidewall of the channel hole, and the semiconductor channel is then deposited over the memory film. The blocking layer, storage layer, and tunneling layer can be subsequently deposited in this order using one or more thin film deposition processes, such as ALD, CVD, PVD, any other suitable processes, or any combination thereof, to form the memory film. The semiconductor channel can then be formed by depositing polysilicon on the tunneling layer using one or more thin film deposition processes, such as ALD, CVD, PVD, any other suitable processes, or any combination thereof. Compared with the fabrication process described above with respect to FIGS. 6D and 8 in which a portion of channel structure 611 in DSG cut region 605 is removed by DSG cut 614, channel structure 711 in DSG cut region 705 is not etched, thereby reducing the fabrication complexity.

Figure 7D:
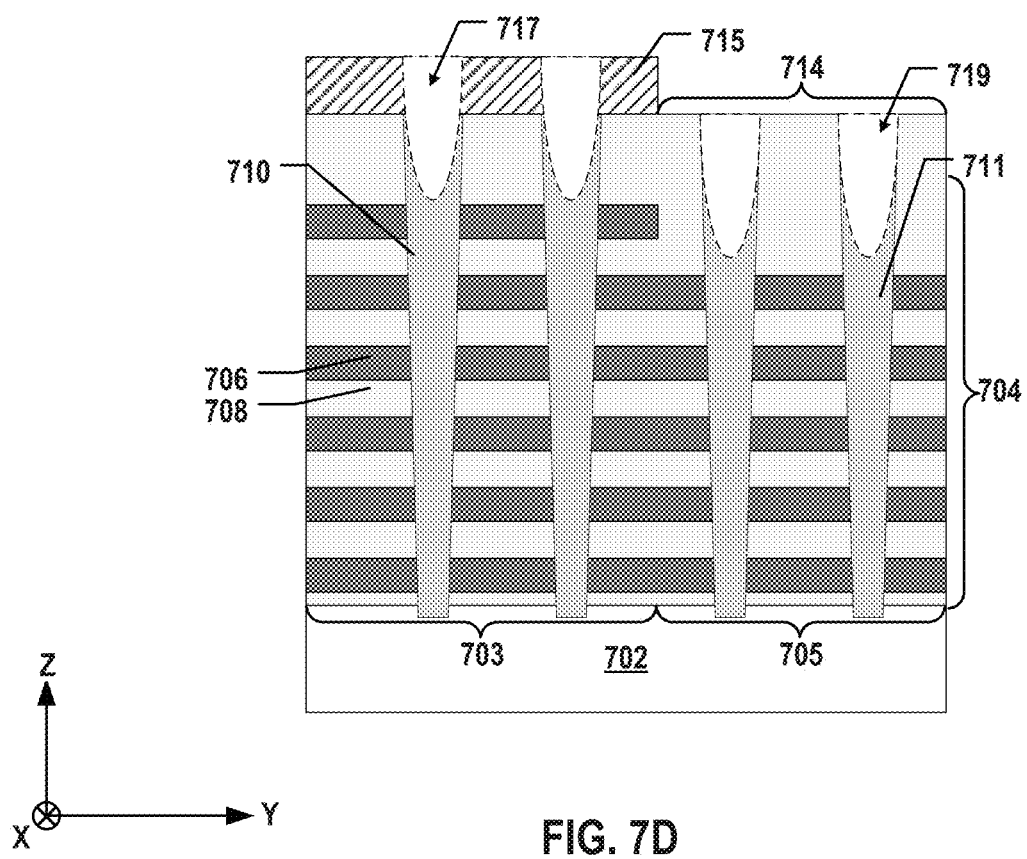

As illustrated in FIG. 7D, an elevating layer 715 is formed on non-DSG cut region 703 of dielectric stack 704. Elevating layer 715 can include any suitable materials, such as silicon oxide or polysilicon. In some embodiments, the fabrication processes for forming elevating layer 715 include depositing a material, such as silicon oxide, on dielectric stack 704 using one or more thin film deposition processes, such as ALD, CVD, PVD, electroplating, electroless plating, or any combination thereof, and patterning the deposited material to cover non-DSG cut region 703, but not DSG cut region 705, using lithography, development, dry etching, and/or wet etching.

As illustrated in FIG. 7D, recesses 717 through elevating layer 715 into the top portions of channel structures 710 in non-DSG cut region 703, and recesses 719 into the top portions of channel structures 711 in DSG cut region 705 are simultaneously formed. An etching mask (not shown) can be first patterned to expose areas aligned with channel structures 710 and 711. In some embodiments, recesses 717 and 719 are simultaneously formed by wet etching and/or drying etching parts of the memory film, semiconductor channel, and capping layer in the top portion of channel structures 710 or 711 through the etching mask. The etching first goes through elevating layer 715 in non-DSG cut region 703 before starting to etch channel structures 710, according to some embodiments. In some embodiments, the depth of recess 717 in non-DSG cut region 703 is nominally the same as the depth of recess 719 in DSG cut region 705, according to some embodiments. The lower ends of recesses 717 in non-DSG cut region 703 can be higher than the lower ends of recesses 719 in DSG cut region 705 due to elevating layer 715. By controlling the properties (e.g., the thickness and/or material) of elevating layer 715 and/or the etching conditions (e.g., etching rate, cycles, and/or time), the etching can be stopped when the lower ends of recesses 717 in non-DSG cut region 703 are higher than the first uppermost sacrificial layer 706 and the lower ends of recesses 719 in DSG cut region 705 are between the first and second sacrificial layers 706.

Figure 7E:
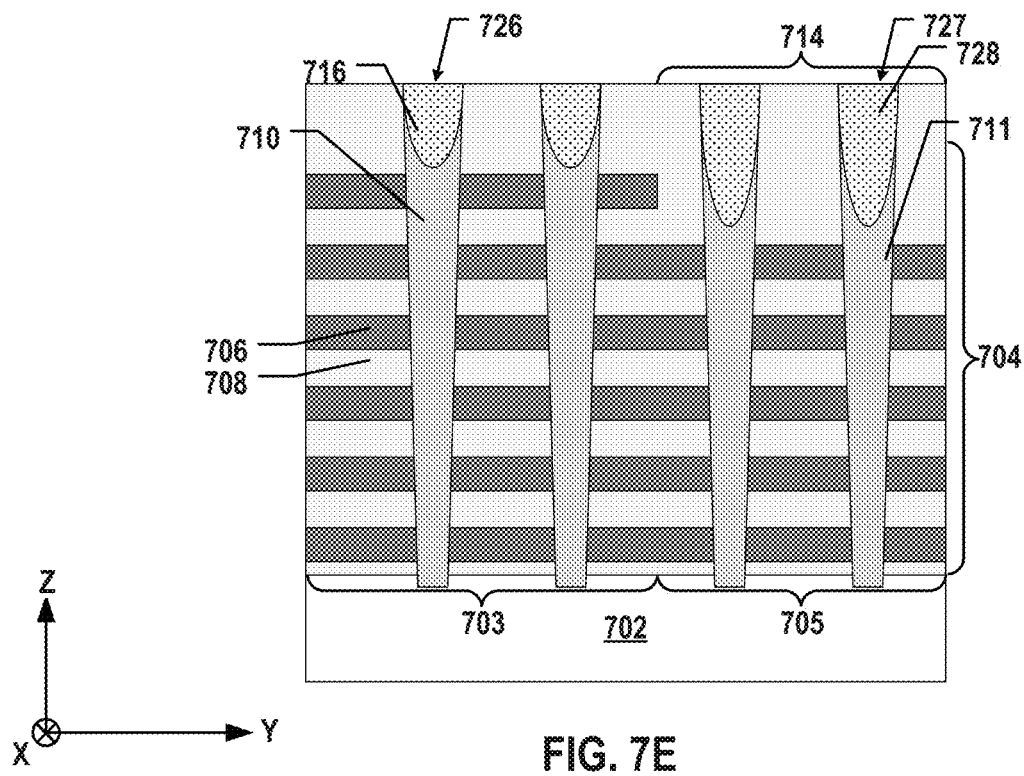

As illustrated in FIG. 7E, channel plugs 716 and 728 then can be simultaneously formed by depositing semiconductor materials, such as polysilicon, into recesses 717 and 719 (shown in FIG. 7D), respectively, using one or more thin film deposition processes, such as CVD, PVD, ALD, or any combination thereof. A planarization process, such as CMP, wet etching, and/or dry etching, can then be applied to planarize the channel plugs 716 and 728, such that the upper ends of channel plugs 716 and 728 and the top surface of dielectric stack 704 are flush with one another. Elevating layer 715 can be removed by the planarization process or in an etching process prior to the formation of channel plugs 716 and 728. As a result, the height of channel plug 728 in DSG cut region 705 is greater than the height of channel plug 716 in non-DSG cut region 703 after the planarizing, according to some embodiments. In some embodiments, the lower end of channel plug 716 in non-DSG cut region 703 is higher than the remainder of the first uppermost sacrificial layer 706, and the lower end of channel plug 728 in DSG cut region 705 is lower than the remainder of the first uppermost sacrificial layer 706, for example, between the first and second uppermost sacrificial layers 706. Memory strings 726 each including a respective channel structure 710 and channel plug 716 can be thereby formed through dielectric stack 704 including the remainder of the first uppermost sacrificial layer 706 in non-DSG cut region 703. Memory strings 727 each including a respective channel structure 711 and channel plug 728 can be thereby formed through dielectric stack 704 free of the first uppermost sacrificial layer 706 in DSG cut region 705.

Figure 7F:
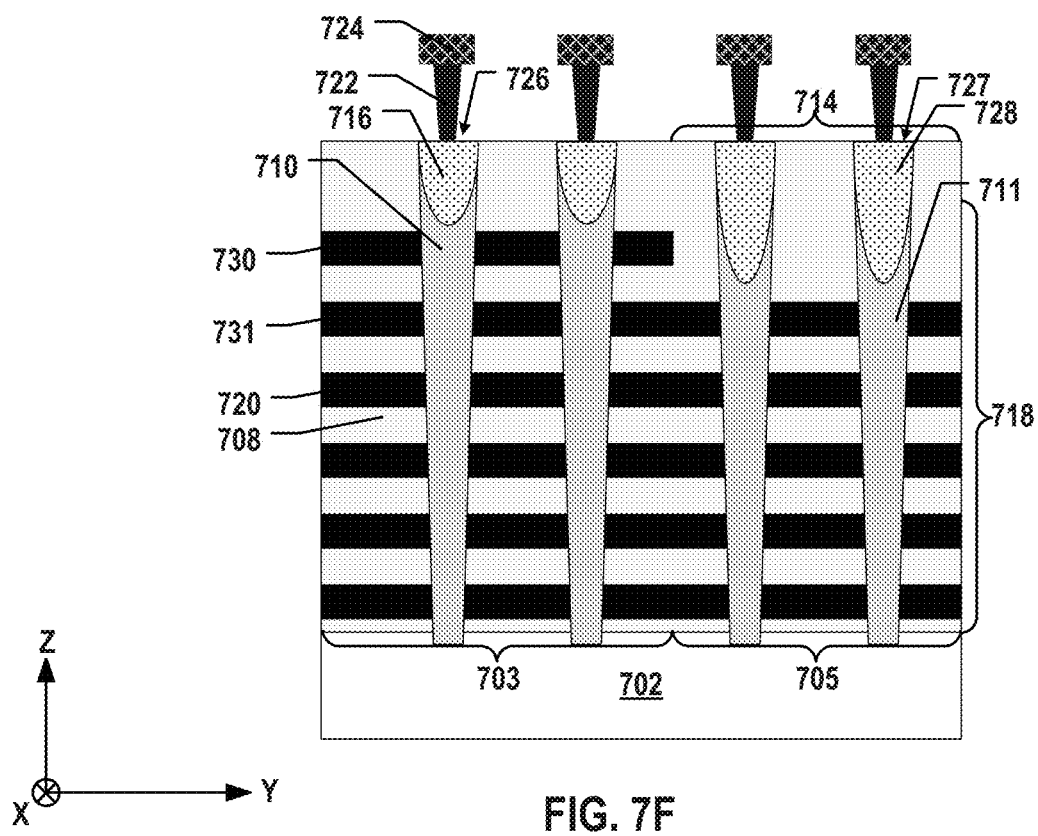

Method 900 proceeds to operation 908, as illustrated in FIG. 9, in which a memory stack including interleaved conductive layers and the dielectric layers is formed by replacing the sacrificial layers of the dielectric stack with the conductive layers (i.e., the so-called "gate replacement" process). As illustrated in FIG. 7F, sacrificial layers 706 (shown in FIG. 7E) are replaced with conductive layers 720, and a memory stack 718 including interleaved conductive layers 720 and dielectric layers 708 is thereby formed. In some embodiments, lateral recesses (not shown) are first formed by removing sacrificial layers 706 through a slit opening (not shown). In some embodiments, sacrificial layers 706 are removed by applying etching solutions through the slit opening, such that sacrificial layers 706 are removed, creating the lateral recesses interleaved between dielectric layers 708. The etching solutions can include any suitable etchants that etch sacrificial layers 706 selective to dielectric layers 708. As illustrated in FIG. 7F, conductive layers 720 are deposited into the lateral recesses through the slit opening. In some embodiments, gate dielectric layers (not shown) are deposited into the lateral recesses prior to conductive layers 720, such that conductive layers 720 are deposited on the gate dielectric layers. Conductive layers 720, such as metal layers, can be deposited using one or more thin film deposition processes, such as ALD, CVD, PVD, any other suitable processes, or any combination thereof. DSG lines 730 and 731 are thereby formed, replacing the remainder of the first uppermost sacrificial layer 706 and the second uppermost sacrificial layer 706, respectively, according to some embodiments.

Method 900 proceeds to operation 910, as illustrated in FIG. 9, in which a first bit line contact and a second bit line contact are formed above and in contact with the first memory string and the second memory string, respectively. In some embodiments, a plurality of bit lines are formed above and in contact with the first bit line contact and the second bit line contact, respectively.

As illustrated in FIG. 7F, bit line contacts 722 are formed above and in contact with channel plugs 716 of memory strings 726 in non-DSG cut region 703 as well as channel plugs 728 of memory strings 727 in DSG cut region 705, respectively. As the upper ends of channel plugs 716 and 728 are flush with one another, each bit line contact 722 has nominally the same height, according to some embodiments. As a result, fabrication complexity can be reduced compared with the example described above with respect to FIGS. 6F and 8 in which bit line contacts 622 and 623 with different heights between non-DSG cut region 603 and DSG cut region 605 need to be formed. In some embodiments, to form bit line contacts 722, bit line contact openings are formed through a dielectric layer on memory stack 718 using wet etching/dry etching, such as RIE. In some embodiments, the etching process stops at the upper ends of channel plugs 716 and 728 of memory strings 726 and 727 to expose the upper end of channel plugs 716 and 728. Bit line contacts 722 can then be formed by depositing conductive materials into the bit line contact openings using thin film deposition processes, such as ALD, CVD, PVD, any other suitable processes, or any combination thereof, followed by a CMP process.

As illustrated in FIG. 7F, bit lines 724 are formed above and in contact with bit line contacts 722 in non-DSG cut region 703 and DSG cut region 705, respectively. The height of each bit line 724 is nominally the same, according to some embodiments. In some embodiments, to form bit lines 724, bit line openings are formed through a dielectric layer on bit line contacts 722 using wet etching/dry etching, such as RIE. In some embodiments, the etching process stops at the upper ends of bit line contacts 722. Bit lines 724 can then be formed by depositing conductive materials into the bit line openings using thin film deposition processes, such as ALD, CVD, PVD, any other suitable processes, or any combination thereof, followed by a CMP process.

Figure 7G:
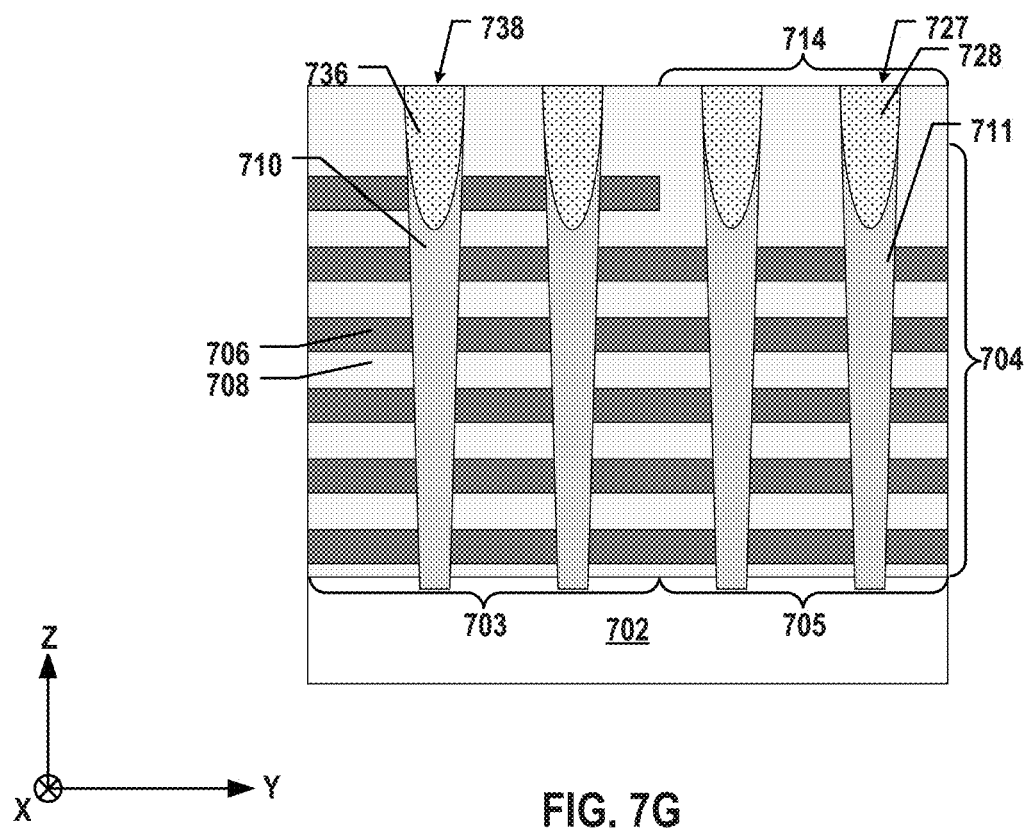
Figure 7H:
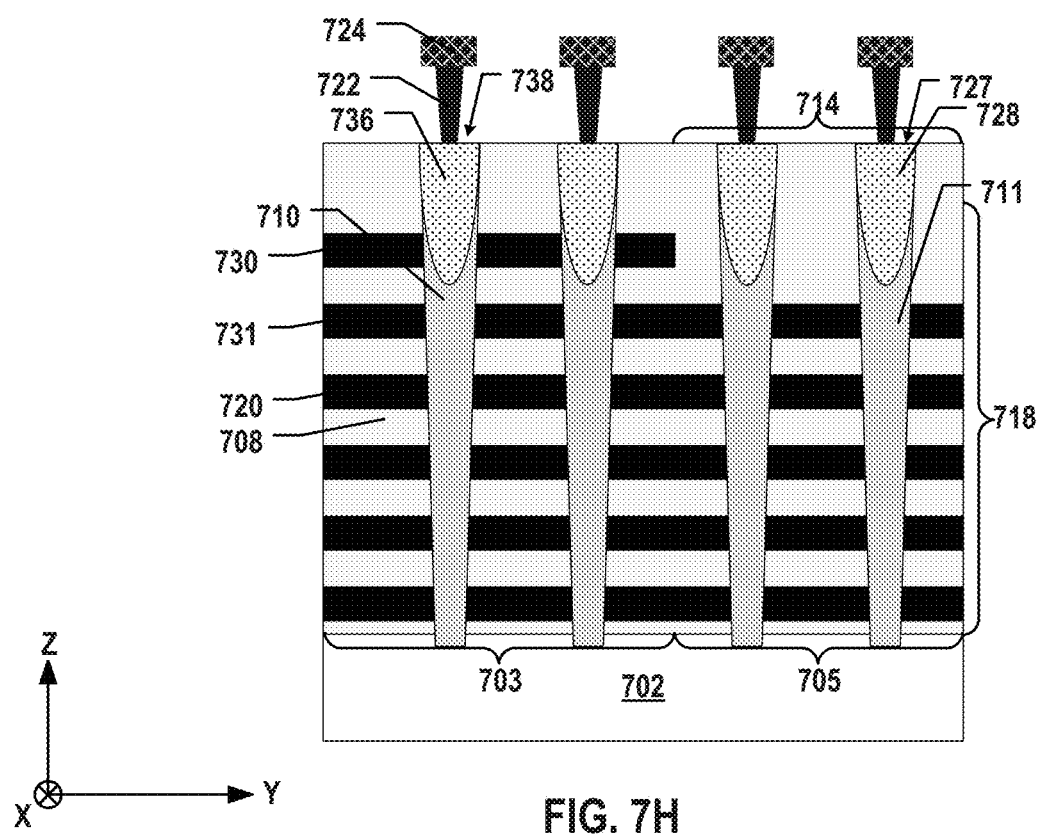

It is understood the operation 906 of method 900 in FIG. 9 may be implemented by another example as shown in FIGS. 7G and 7H. In some embodiments, to form the first and second memory strings, a first channel structure and a second structure extending vertically through the first region and the second region of the dielectric stack, respectively, are simultaneously formed, a first recess into a top portion of the first channel structure, and a second recess into a top portion of the second channel structure are simultaneously formed, and a first channel plug and a second channel plug in the first recess and the second recess, respectively, are simultaneously formed. In some embodiments, to form the first and second memory strings, the first and second channel plugs are planarized, such that upper ends of the first and second memory strings and the top surface of the dielectric stack are flush with one another. In some embodiments, the height of the second channel plug is nominally the same as the height of the first channel plug after the planarizing. In some embodiments, lower ends of the first and second channel plugs are lower than the remainder of the uppermost sacrificial layer.

After completing the process shown in FIG. 7C and without forming elevating layer 715 in FIG. 7D, recesses (not shown) into the top portions of channel structures 710 in non-DSG cut region 703, and recesses (not shown) into the top portions of channel structure 711 in DSG cut region 705 are simultaneously formed. An etching mask (not shown) can be first patterned to expose areas aligned with channel structures 710 and 711. In some embodiments, the recesses are simultaneously formed by wet etching and/or drying etching parts of the memory film, semiconductor channel, and capping layer in the top portion of channel structures 710 or 711 through the etching mask. Without elevating layer 715, the depth of each recess in non-DSG cut region 703 is nominally the same as the depth of each recess in DSG cut region 705, according to some embodiments. The lower ends of the recesses in non-DSG cut region 703 can be flush with the lower ends of the recesses in DSG cut region 705. By controlling the etching conditions (e.g., etching rate, cycles, and/or time), the etching can be stopped when the lower ends of the recesses in non-DSG cut region 703 and DSG cut region 705 are between the first and second uppermost sacrificial layers 706.

As illustrated in FIG. 7G, channel plugs 736 and 728 can be simultaneously formed by depositing semiconductor materials, such as polysilicon, into the recesses in non-DSG cut region 703 and DSG cut region 705, respectively, using one or more thin film deposition processes, such as CVD, PVD, ALD, or any combination thereof. A planarization process, such as CMP, wet etching, and/or dry etching, can then be applied to planarize the channel plugs 736 and 728, such that the upper ends of channel plugs 736 and 728 and the top surface of dielectric stack 704 are flush with one another. As a result, the height of channel plug 728 in DSG cut region 705 is nominally the same as the height of channel plug 736 in non-DSG cut region 703 after the planarizing, according to some embodiments. In some embodiments, the lower end of each channel plug 736 or 738 is lower than the remainder of the first uppermost sacrificial layer 706, for example, between the first and second uppermost sacrificial layers 706. Memory strings 738 each including a respective channel structure 710 and channel plug 736 can be thereby formed through dielectric stack 704 including the remainder of the first uppermost sacrificial layer 706 in non-DSG cut region 703. Memory strings 727 each including a respective channel structure 711 and channel plug 728 can be thereby formed through dielectric stack 704 free of the first uppermost sacrificial layer 706 in DSG cut region 705.

As illustrated in FIG. 7H, bit line contacts 722 are formed above and in contact with channel plugs 736 of memory strings 738 in non-DSG cut region 603 as well as channel plugs 728 of memory strings 727 in DSG cut region 705, respectively. Bit lines 724 can be formed above and in contact with bit line contacts 722 in non-DSG cut region 703 and DSG cut region 705, respectively.

Figure 10:
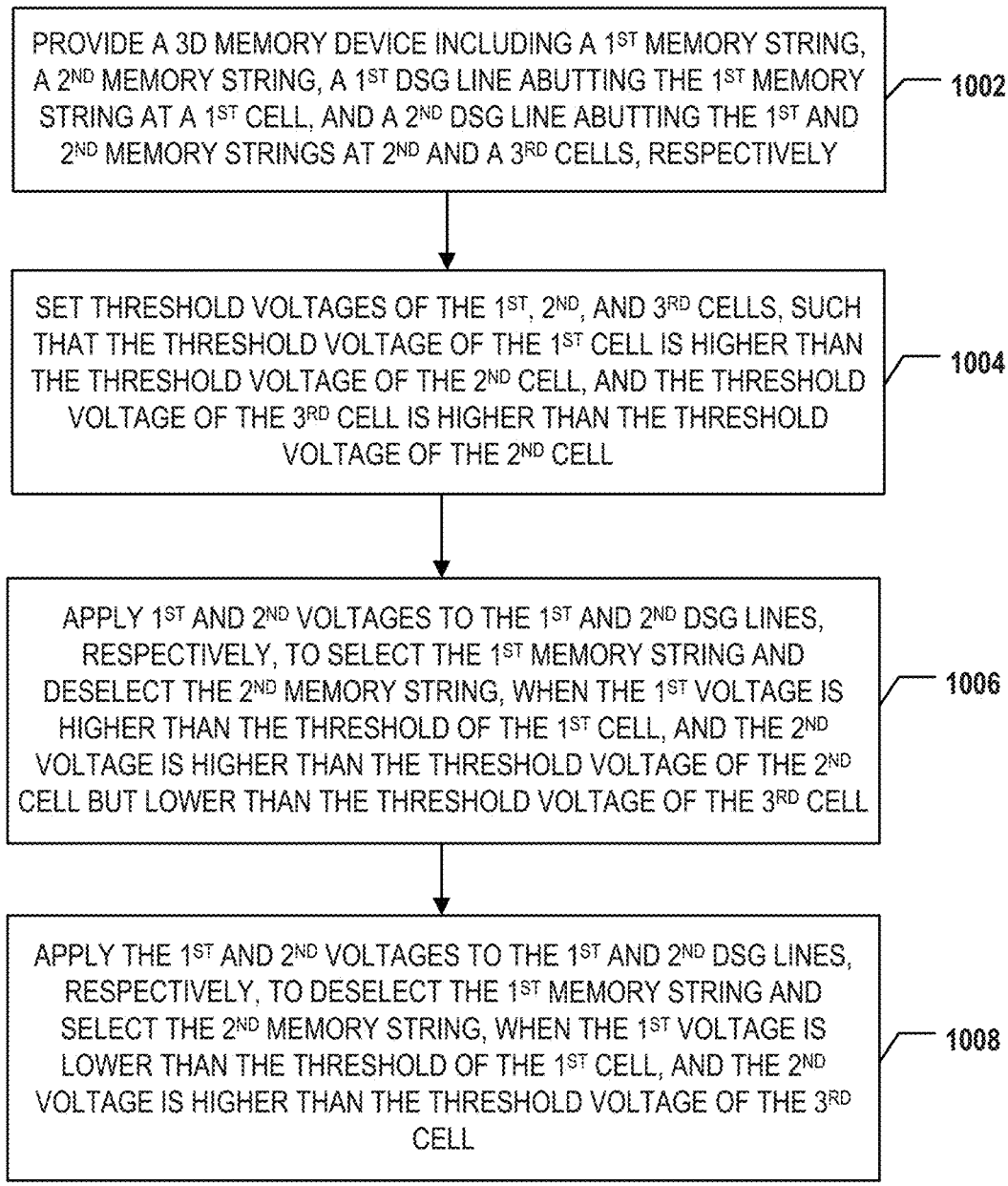
FIG. 10 illustrates a flowchart of a method for operating an exemplary 3D memory device with DSG cut, according to some embodiments of the present disclosure.

FIG. 10 illustrates a flowchart of a method 1000 for operating an exemplary 3D memory device with DSG cut, according to some embodiments of the present disclosure.

Although FIG. 10 will be described below together with the examples of 3D memory devices 200 and 300 depicted in FIGS. 2B and 3B, it is understood that method 1000 may be similarly implemented using any other suitable examples of 3D memory devices disclosed herein, such as 3D memory device 400, 401, or 501 depicted in FIGS. 4A, 4B, and 5B, in the same vein. It is also understood that the operations shown in method 1000 are not exhaustive and that other operations can be performed as well before, after, or between any of the illustrated operations. Further, some of the operations may be performed simultaneously, or in a different order than shown in FIG. 10.

Referring to FIG. 10, method 1000 starts at operation 1002, in which a 3D memory device including a first memory string, a second memory string, a first DSG line abutting the first memory string at a first cell, and a second DSG line abutting the first and second memory strings at a second cell and a third cell, respectively, is provided. In some embodiments, the first DSG line does not abut the second memory string. In some embodiments, the first and second cells are configured to control a drain of the first memory string, and the third cell is configured to control a drain of the second memory string.

As illustrated in FIG. 2B, 3D memory device 200 includes first memory string 210 in non-DSG cut region 204, second memory string 210 in DSG cut region 206, first DSG line 228 abutting first memory string 210 in non-DSG cut region 204 at first DSG cell 214, and second DSG line 230 abutting first and second memory strings 210 in non-DSG cut region 204 and DSG cut region 206 at second and third DSG cells 216 and 218, respectively, according to some embodiments. In some embodiments, first DSG line 228 does not abut second memory string 210 in DSG cut region 206 due to DSG cut 208. In some embodiments, first and second DSG cells 214 and 216 are configured to control the drain of first memory string 210 in non-DSG cut region 204, and third DSG cell 218 is configured to control the drain of second memory string 210 in DSG cut region 206.

Method 1000 proceeds to operation 1004, as illustrated in FIG. 10, in which threshold voltages of the first, second, and third cells are set, such that the threshold voltage of the first cell is higher than the threshold voltage of the second cell, and the threshold voltage of the third cell is higher than the threshold voltage of the second cell. In some embodiments, the threshold voltages of the first and third cells are nominally the same.

As illustrated in FIG. 2B, the threshold voltage $V_{t1}$ of first DSG cell 214, the threshold voltage $V_{t2}$ of second DSG cell 216, and the threshold voltage $V_{t3}$ of third DSG cell 218 are set, such that the threshold voltage $V_{t1}$ of first DSG cell 214 is higher than the threshold voltage $V_{t2}$ of second DSG cell 216, and the threshold voltage $V_{t3}$ of third DSG cell 218 is higher than the threshold voltage $V_{t2}$ of second DSG cell 216, i.e., $V_{t1}>V_{t2}$, and $V_{t3}>V_{t2}$. In some embodiments, the threshold voltage $V_{t1}$ of first DSG cell 214 is nominally the same as the threshold voltage $V_{t3}$ of third DSG cell 218, i.e., $V_{t1}=V_{t3}>V_{t2}$. Each DSG cell 214, 216 or 218 can be a transistor having its intrinsic threshold voltage determined by, for example, the dimensions and the properties of the semiconductor materials (and dopants if any) in the semiconductor channel in a respective channel structure 212, such as carrier concentration and carrier mobility. Each threshold voltage $V_{t1}$, $V_{t2}$, or $V_{t2}$ of DSG cell 214, 216 or 218 can be set to a desired level from its intrinsic threshold voltage by, for example, the manufacturer and/or the user, after the manufacturing of 3D memory device 200, using, for example, the program and/or erase operations.

Method 1000 proceeds to operation 1006, as illustrated in FIG. 10, in which a first voltage and a second voltage are applied to the first and second DSG lines, respectively, to select the first memory string and deselect the second memory string, when the first voltage is higher than the threshold of the first cell, and the second voltage is higher than the threshold voltage of the second cell but lower than the threshold voltage of the third cell.

As illustrated in FIG. 2B, the first voltage $V_{dsg0}$ is applied to first DSG line 228, and the second voltage $V_{dsg1}$ is applied to second DSG line 230, according to some embodiments. When the first voltage $V_{dsg0}$ is higher than the threshold $V_{t1}$ of first DSG cell 214, and the second voltage $V_{dsg1}$ is higher than the threshold voltage $V_{t2}$ of second DSG cell 216 but lower than the threshold voltage $V_{t3}$ of third DSG cell 218, i.e., $V_{dsg0}>V_{t1}$, and $V_{t3}>V_{dsg1}>V_{t2}$, both first and second DSG cells 214 and 216 of first memory string 210 in non-DSG cut region 204 are on, while third DSG cell 218 of second memory string 210 in DSG cut region 206 is off, according to some embodiments. As a result, first memory string 210 in non-DSG cut region 204 may be selected, while second memory string 210 in DSG cut region 206 may be deselected.

Method 1000 proceeds to operation 1008, as illustrated in FIG. 10, in which the first voltage and the second voltage are applied to the first and second DSG lines, respectively, to deselect the first memory string and select the second memory string, when the first voltage is lower than the threshold of the first cell, and the second voltage is higher than the threshold voltage of the third cell.

As illustrated in FIG. 2B, the first voltage $V_{dsg0}$ is applied to first DSG line 228, and the second voltage $V_{dsg1}$ is applied to second DSG line 230, according to some embodiments. When the first voltage $V_{dsg0}$ is lower than the threshold $V_{t1}$ of first DSG cell 214, and the second voltage $V_{dsg1}$ is higher than the threshold voltage $V_{t3}$ of third DSG cell 218, i.e., $V_{dsg0}<V_{t1}$, and $V_{dsg1}>V_{t3}$, first DSG cell 214 is on, second DSG cell 216 is off, and third DSG cell 218 is on, according to some embodiments. As a result, first memory string 210 in non-DSG cut region 204 may be deselected (as second DSG cell 216 is oft), while second memory string 210 in DSG cut region 206 may be selected.

It is understood that the operation method disclosed above with respect to FIGS. 2B and 10 may be similarly applied to 3D memory device 300 in FIG. 3B in the same vein. As described above, 3D memory device 300 can include memory strings 310 in two non-DSG cut regions 304 and 305 and DSG cut region 306, three DSG lines 328, 329, and 330, and five DSG cells 314, 315, 316, 317, and 318. By setting the threshold voltages $V_{t1}$, $V_{t2}$, $V_{t3}$, $V_{t4}$, and $V_{t5}$ of first, second, third, fourth, and fifth DSG cells 314, 315, 316, 317, and 318 and applying the first, second, and third voltages $V_{dsg0}$, $V_{dsg}1$, and $V_{dsg2}$ to first, second, and third DSG lines 328, 330, and 329, respectively, according to the exemplary Table I below, first, second, and third memory string 310 in each region 304, 305, or 306 can be individually selected.

TABLE I

| String Region | DSG Cell 1 | DSG Cells 2/4 | DSG Cell 3 | DSG Cell 5 |
| --- | --- | --- | --- | --- |
| 304 Selected | On: $V_{dsg0} > V_{t1}$ | On: $V_{dsg1} > V_{t2/4}$ | Off: $V_{dsg1} < V_{t3}$ | Off: $V_{dsg2} < V_{t5}$ |
| 305 Selected | Off: $V_{dsg0} < V_{t1}$ | On: $V_{dsg1} > V_{t2/4}$ | Off: $V_{dsg1} < V_{t3}$ | On: $V_{dsg2} > V_{t5}$ |
| 306 Selected | Off: $V_{dsg0} < V_{t1}$ | On: $V_{dsg1} > V_{t2/4}$ | On: $V_{dsg1} > V_{t3}$ | Off: $V_{dsg2} < V_{t5}$ |

According to one aspect of the present disclosure, a 3D memory device includes a memory stack, a plurality of memory strings, and a plurality of bit line contacts each in contact with a respective one of the plurality of memory strings. The memory stack includes interleaved conductive layers and dielectric layers. Each memory string extends vertically through the memory stack. The conductive layers include a plurality of drain select gate (DSG) lines configured to control drains of the plurality of memory strings. The plurality of memory strings are divided into a plurality of regions that are a minimum repeating unit of the memory stack in a plan view. Each of the plurality of memory strings abuts at least one of the DSG lines.

In some embodiments, the plurality of regions include a DSG cut region and a non-DSG cut region, and the number of the DSG lines in the non-DSG cut region is greater than the number of the DSG lines in the DSG cut region.

In some embodiments, the number of the memory strings in the non-DSG cut region is the same as the number of the memory strings in the DSG cut region.

In some embodiments, the DSG cut region is free of dummy memory string.

In some embodiments, a height of each of the memory strings in the non-DSG cut region is greater than a height of each of the memory strings in the DSG cut region.

In some embodiments, a height of each of the bit line contacts in the DSG cut region is greater than a height of each of the bit line contacts in the non-DSG cut region.

In some embodiments, the plurality of regions include the DSG cut region between two non-DSG cut regions in the plan view.

In some embodiments, each of the memory strings include a channel plug at one end thereof in contact with the respective bit line contact.

In some embodiments, the channel plugs in the DSG-cut region is vertically between at least two of the DSG lines.

In some embodiments, the 3D memory device further includes a GLS extending laterally in a word line direction, and the DSG-cute region extends laterally in the word line direction parallel to the GLS.

In some embodiments, the DSG lines include the outermost ones of the conductive layers.

In some embodiments, the memory strings in the DSG cut region do not extend beyond the outmost conductive layer.

In some embodiments, the DSG lines have different lateral dimensions.

According to another aspect of the present disclosure, a method for forming a 3D memory device is disclosed. A dielectric stack including interleaved sacrificial layers and dielectric layers is formed above a substrate. A first channel structure and a second channel structure each extending vertically through the dielectric stack are formed. A portion of the uppermost one of the sacrificial layers and a top portion of the second channel structure abutting the removed portion of the uppermost sacrificial layer are removed, such that the first channel structure extends vertically through a first region of the dielectric stack including a remainder of the uppermost sacrificial layer, and a remainder of the second channel structure extends vertically through a second region of the dielectric stack free of the uppermost sacrificial layer.

In some embodiments, to simultaneously form the first and second memory strings, a first channel structure and a second structure extending vertically through the first region and the second region of the dielectric stack, respectively, are simultaneously formed, a dielectric elevating layer is formed on the first region, but not the second region, of the dielectric stack, a first recess through the dielectric elevating layer into a top portion of the first channel structure, and a second recess into a top portion of the second channel structure are simultaneously formed, and a first channel plug and a second channel plug in the first recess and the second recess, respectively, are simultaneously formed.

In some embodiments, a first channel plug in a top portion of the first channel structure, and a second channel plug in a top portion of the remainder of the second channel structure are formed.

In some embodiments, a memory stack including interleaved conductive layers and the dielectric layers is formed by replacing the sacrificial layers of the dielectric stack with the conductive layers, and a first bit line contact and a second bit line contact above and in contact with the first channel plug and the second channel plug, respectively, are formed.

In some embodiments, a lower end of the first channel plug is higher than the remainder of the uppermost sacrificial layer, and an upper end of the second channel plug is lower than the remainder of the uppermost sacrificial layer.

According to still another aspect of the present disclosure, a method for operating a 3D memory device is disclosed. The 3D memory device including a first memory string, a second memory string, a DSG line abutting the first memory string at a first cell, and a second DSG line abutting the first and second memory strings at a second cell and a third cell, respectively, is provided. Threshold voltages of the first, second, and third cells are set, such that the threshold voltage of the first cell is higher than the threshold voltage of the second cell, and the threshold voltage of the third cell is higher than the threshold voltage of the second cell. A first voltage and a second voltage are applied to the first and second DSG lines, respectively, to select the first memory string and deselect the second memory string, when the first voltage is higher than the threshold of the first cell, and the second voltage is higher than the threshold voltage of the second cell but lower than the threshold voltage of the third cell.

In some embodiments, the first voltage and the second voltage are applied to the first and second DSG lines, respectively, to deselect the first memory string and select the second memory string, when the first voltage is lower than the threshold of the first cell, and the second voltage is higher than the threshold voltage of the third cell.

In some embodiments, the threshold voltages of the first and third cells are nominally the same.

In some embodiments, the first and second cells are configured to control a drain of the first memory string, and the third cell is configured to control a drain of the second memory string.

In some embodiments, the first DSG line does not abut the second memory string.

The foregoing description of the specific embodiments will so reveal the general nature of the present disclosure that others can, by applying knowledge within the skill of the art, readily modify and/or adapt for various applications such specific embodiments, without undue experimentation, without departing from the general concept of the present disclosure. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

Embodiments of the present disclosure have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The Summary and Abstract sections may set forth one or more but not all exemplary embodiments of the present disclosure as contemplated by the inventor(s), and thus, are not intended to limit the present disclosure and the appended claims in any way.

The breadth and scope of the present disclosure should not be limited by any of the above-described exemplary embodiments, but should be defined only in accordance with the following claims and their equivalents.

What is claimed is:

1. A three-dimensional (3D) memory device, comprising:
a memory stack comprising vertically interleaved conductive layers and dielectric layers;
a plurality of memory strings each extending vertically through the memory stack; and
a plurality of bit line contacts each in contact with a respective one of the plurality of memory strings,
wherein the conductive layers comprise a plurality of drain select gate (DSG) lines configured to control drains of the plurality of memory strings;
the plurality of memory strings are divided into a plurality of regions that are a minimum repeating unit of the memory stack in a plan view; and
each of the plurality of memory strings abuts at least one of the DSG lines.

2. The 3D memory device of claim 1, wherein
the plurality of regions comprise a DSG cut region and a non-DSG cut region; and
the number of the DSG lines in the non-DSG cut region is greater than the number of the DSG lines in the DSG cut region.

3. The 3D memory device of claim 2, wherein the number of the memory strings in the non-DSG cut region is the same as the number of the memory strings in the DSG cut region.

4. The 3D memory device of claim 2, wherein the DSG cut region is free of dummy memory string.

5. The 3D memory device of claim 2, wherein a height of each of the memory strings in the non-DSG cut region is greater than a height of each of the memory strings in the DSG cut region.

6. The 3D memory device of claim 2, wherein a height of each of the bit line contacts in the DSG cut region is greater than a height of each of the bit line contacts in the non-DSG cut region.

7. The 3D memory device of claim 2, wherein the plurality of regions comprise the DSG cut region between two non-DSG cut regions in the plan view.

8. The 3D memory device of claim 2, wherein each of the memory strings comprise a channel plug at one end thereof in contact with the respective bit line contact.

9. The 3D memory device of claim 8, wherein the channel plugs in the DSG-cut region is vertically between at least two of the DSG lines.

10. The 3D memory device of claim 2, further comprising a gate line slit (GLS) extending laterally in a word line direction, and the DSG-cute region extends laterally in the word line direction parallel to the GLS.

11. The 3D memory device of claim 1, wherein the DSG lines comprise the outermost ones of the conductive layers.

12. The 3D memory device of claim 11, wherein the memory strings in the DSG cut region do not extend beyond the outmost conductive layer.

13. The 3D memory device of claim 1, wherein the DSG lines have different lateral dimensions.

* * * * *